(12) United States Patent
Zhai

(10) Patent No.: US 12,295,207 B2
(45) Date of Patent: May 6, 2025

(54) DISPLAY PANEL AND DISPLAY DEVICE

(71) Applicant: Shanghai Tianma Micro-Electronics Co., Ltd., Shanghai (CN)

(72) Inventor: Yingteng Zhai, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 759 days.

(21) Appl. No.: 17/565,551

(22) Filed: Dec. 30, 2021

(65) Prior Publication Data

US 2022/0123059 A1   Apr. 21, 2022

(30) Foreign Application Priority Data

Sep. 2, 2021  (CN) .......................... 202111027637.6

(51) Int. Cl.
*H10K 59/121* (2023.01)
*G02B 27/44* (2006.01)

(52) U.S. Cl.
CPC .......... *H10K 59/121* (2023.02); *G02B 27/44* (2013.01)

(58) Field of Classification Search
CPC .................................................. H10K 59/121
See application file for complete search history.

(56) References Cited

U.S. PATENT DOCUMENTS 11,264,431 B2 *  3/2022  Zhang ................. H10K 59/121
11,567,311 B1 *  1/2023  Qiao ..................... G02B 26/023
2019/0250450 A1 *  8/2019  Li ........................... G02F 1/1306

FOREIGN PATENT DOCUMENTS

CN   109448575 A   3/2019
CN   110797385 A   2/2020

* cited by examiner

*Primary Examiner* — Douglas M Menz
(74) *Attorney, Agent, or Firm* — KDW Firm PLLC

(57) ABSTRACT

Provided are a display panel and a display device. The display panel includes at least one light-transmitting region block. Each light-transmitting region block includes R*S light-transmitting regions arranged in R rows and S columns, R is an integer greater than or equal to 2, and S is an integer greater than or equal to 2. In each light-transmitting region block, S light-transmitting regions located in the same row are S types of different light-transmitting regions, and R light-transmitting regions located in the same column are R types of different light-transmitting regions. In the light-transmitting region block, adjacent light-transmitting regions are different types of light-transmitting regions. Thus, a fixed grating will not be formed from the adjacent light-transmitting regions so that the optical paths or phase differences are different when external light passes through two different light-transmitting regions.

19 Claims, 13 Drawing Sheets

DISPLAY PANEL AND DISPLAY DEVICE

CROSS-REFERENCE TO RELATED APPLICATION

This application claims priority to Chinese Patent Application No. 202111027637.6 filed Sep. 2, 2021, the disclosure of which is incorporated herein by reference in its entirety.

FIELD

Embodiments of the present disclosure relate to display technologies and in particular to a display panel and a display device.

BACKGROUND

A transparent display screen has a wide application prospect. The transparent display screen is applicable to small-size intelligent devices and also applicable to large-size display windows, outdoor billboards, flat panel for display, and the like. Some related products have been released on the market at present.

A transparent display device may be used to display images or may allow a user to view objects or images located on the back side of the display device.

However, diffraction is easily generated when light passes through a transparent region of a conventional transparent display device so that a display effect of the transparent display device is affected.

SUMMARY

Embodiments of the present disclosure provide a display panel and a display device.

The embodiments of the present disclosure provide the display panel including at least one light-transmitting region block.

Each of the at least one light-transmitting region block includes R*S light-transmitting regions arranged in R rows and S columns, R is an integer greater than or equal to 2, and S is an integer greater than or equal to 2.

In each of the at least one light-transmitting region block, S light-transmitting regions located in a same row are S types of different light-transmitting regions, and R light-transmitting regions located in a same column are R types of different light-transmitting regions.

Based on the same inventive concept, the embodiments of the present disclosure further provide the display device including the display panel described above.

BRIEF DESCRIPTION OF DRAWINGS

To illustrate technical solutions in the embodiments of the present disclosure or in the related art more clearly, drawings used in description of the embodiments or the related art will be briefly described below. Apparently, even though the drawings described below illustrate merely part of the embodiments of the present disclosure, for those skilled in the art, an expansion and extension may be made to other structures and drawings according to basic concepts of a device structure, a driving method, and a manufacturing method provided and indicated by various embodiments of the present disclosure. No doubt these should be within the scope of the claims of the present disclosure.

FIG. 22 is a schematic diagram of another display panel according to an embodiment of the present disclosure;

FIG. 23 is a schematic diagram of another display panel according to an embodiment of the present disclosure;

FIG. 24 is a schematic diagram of another display panel according to an embodiment of the present disclosure;

FIG. 25 is a schematic diagram of another display panel according to an embodiment of the present disclosure;

DETAILED DESCRIPTION

In order to make objectives, technical solutions, and advantages of the present disclosure clearer, the technical solutions of the present disclosure are clearly and completely described below with reference to drawings of embodiments of the present disclosure and in conjunction with implementations. Apparently, the embodiments described herein are part, not all, of the embodiments of the present disclosure. All other embodiments acquired by those skilled in the art on the basis of basic concepts provided and indicated by the embodiments of the present disclosure are within the scope of the present disclosure.

Figure 1:
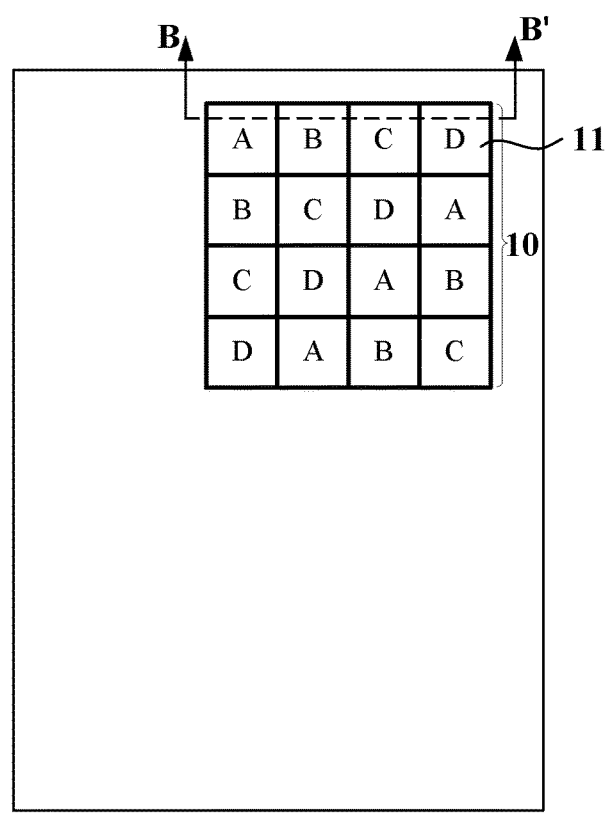
FIG. 1 is a schematic diagram of a display panel according to an embodiment of the present disclosure.

Referring to FIG. 1, a schematic diagram of a display panel according to an embodiment of the present disclosure is provided. As shown in FIG. 1, a display panel includes at least one light-transmitting region block 10, where a light-transmitting region block 10 includes R*S light-transmitting regions 11 arranged in R rows and S columns, R is an integer greater than or equal to 2, and S is an integer greater than or equal to 2. In one light-transmitting region block 10, S light-transmitting regions 11 located in the same row are S types of different light-transmitting regions 11, and R light-transmitting regions 11 located in the same column are R types of different light-transmitting regions 11.

In this embodiment, the display panel includes the at least one light-transmitting region block 10 and the light-transmitting region block 10 may be used for a transparent display or a light-transmitting display. When external light passes through the light-transmitting region block 10 of the display panel, an object or an image located on a non-light-emitting side of the display panel is visible at the position of the light-transmitting region block 10, that is, the object or the image located on the non-light-emitting side of the display panel can be observed on a light-emitting side of the display panel by a user through the light-transmitting region block 10. Thus, a region where the light-transmitting region block 10 of the display panel is located is a transparent display region of the display panel, and the transparent display is implemented. FIG. 1 illustrates a structure of one light-transmitting region block 10 in the display panel, and in other embodiments, a display panel includes a plurality of light-transmitting region blocks, which is not limited thereto.

In an embodiment, a transparent display region where a light-transmitting region block 10 is located may overlap a position of an optical device such as an under-screen camera; the transparent display region of a display panel may be provided with one or more light-transmitting region blocks 10; and in this case, the transparent display region may occupy a part of a display region.

Figure 2:
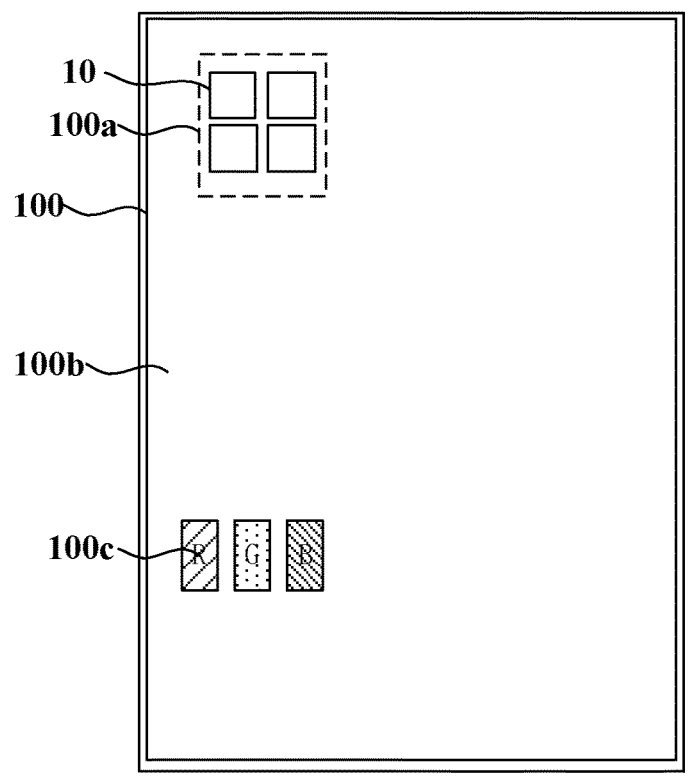
FIG. 2 is a schematic diagram of another display panel according to an embodiment of the present disclosure.

Referring to FIG. 2, a schematic diagram of another display panel according to an embodiment of the present disclosure is provided. As shown in FIG. 2, a display panel further includes a display region 100, the display region 100 includes a first display region 100a, the first display region 100a is an optical device reservation region, and a light-transmitting region block 10 is located in the first display region 100a. For example, when the optical device such as a camera is disposed on the back side of the display panel, a region where the camera is located overlaps the optical device reservation region in the display panel, and the camera may be used to receive light which passes through a light-transmitting region in the optical device reservation region and reaches the camera. In addition, the first display region 100a may further include a light-emitting element used for implementing a display function. A transparent display feature of the first display region 100a will not affect normal operation of the optical device which is disposed corresponding to the optical device reservation region. In addition, the transparent display feature of the first display region 100a can implement a display function of the first display region 100a so that a screen-to-body ratio of the display panel is increased.

The display region 100 further includes a second display region 100b provided with a plurality of light-emitting elements 100c, and the light-emitting elements 100c are used for displaying an image. In an embodiment, the display region 100 includes light-emitting elements 100c emitting three colors, that is, a red light-emitting element R, a green light-emitting element G, and a blue light-emitting element B. For example, light-emitting elements 100c emitting different colors are disposed adjacent to each other, and the three light-emitting elements 100c emitting different colors which are disposed adjacent to each other may form one pixel unit.

In an embodiment, a transparent display region where a light-transmitting region block 10 is located may be used for viewing an object on the back side of a display panel; in this case, the entire display region of the display panel may be configured to be a transparent display region; and the transparent display region includes a plurality of light-transmitting region blocks 10 distributed throughout the entire display region.

Figure 3:
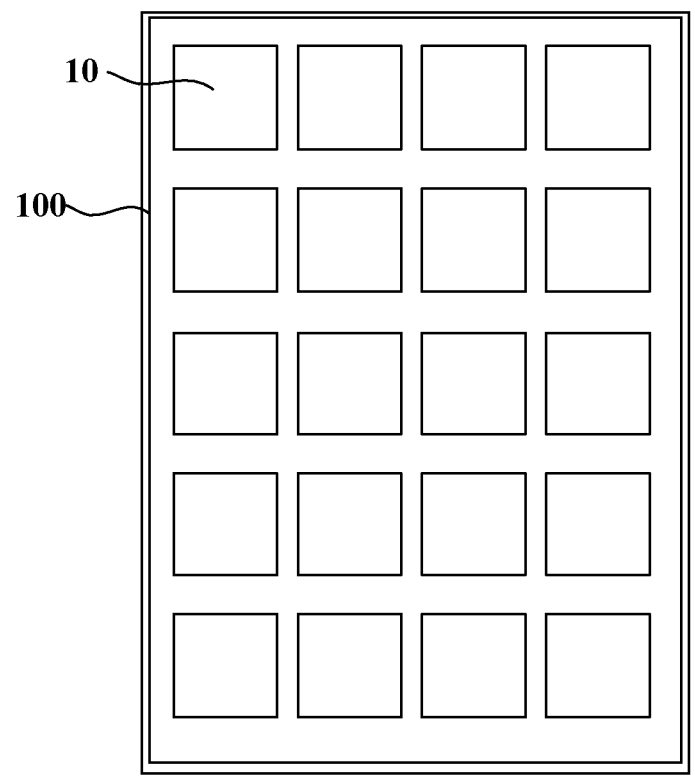
FIG. 3 is a schematic diagram of another display panel according to an embodiment of the present disclosure.

Referring to FIG. 3, a schematic diagram of another display panel according to an embodiment of the present disclosure is provided. As shown in FIG. 3, a transparent display region where a light-transmitting region block 10 is located may be used for viewing the object located on the back side of a display panel. In this case, the entire display region 100 of the display panel may be configured to be a transparent display region; and the transparent display region includes a plurality of light-transmitting region blocks 10 distributed throughout the entire display region 100. The display region 100 of the display panel includes the plurality of light-transmitting region blocks 10, and the display panel is a transparent display panel. In an embodiment, the display region 100 is further provided with a plurality of light-emitting elements for displaying an image. The display region 100 in the display panel can implement light-emitting display of images through the light-emitting elements and can also implement transparent display through the light-transmitting region blocks 10.

It is to be noted that FIG. 3 illustrates a case where distances between the light-transmitting region blocks 10 are each greater than zero and the distances between the light-transmitting region blocks 10 may be adjusted such that distances between light-transmitting regions located in the same light-transmitting region block are the same as distances between light-transmitting regions located in two adjacent light-transmitting region blocks, that is, light-transmitting regions in all light-transmitting region blocks are evenly arranged in the display region.

The light-transmitting region block 10 includes the R*S light-transmitting regions 11 arranged in the R rows and the S columns. For example, in the one light-transmitting region block 10 shown in FIG. 1, R=4 and S=4, that is, the light-transmitting region block 10 totally includes 16 light-transmitting regions 11 in 4 rows and 4 columns. It is to be understood that values of R and S in FIG. 1 are merely examples. In actual manufacture, values of the number of rows R and the number of columns S in a light-transmitting region block are not specifically limited as long as the two values are integers greater than or equal to 2. R and S may be equal to each other as shown in FIG. 1 or R and S may be unequal to each other, which is not limited thereto.

As shown in FIG. 1, in the one light-transmitting region block 10, 4 light-transmitting regions 11 located in the same row are 4 types of different light-transmitting regions 11, and 4 light-transmitting regions 11 located in the same column are 4 types of different light-transmitting regions 11. For example, the R rows and the S columns included by the light-transmitting region block 10 are 4 rows and 4 columns, respectively. The display panel includes at least four types of different light-transmitting regions 11, labelled as a light-transmitting region A, a light-transmitting region B, a light-transmitting region C, and a light-transmitting region D, respectively. It is to be understood that the number of types of different light-transmitting regions in the display panel may be the same as S or R as shown in FIG. 1. For example, S=R=4, and the display panel has 4 types of different light-transmitting regions. In other embodiments, the number of types of different light-transmitting regions in a display panel may be greater than S or greater than R. For example, R=4, S=5, and the display panel has 6 types of different light-transmitting regions.

The light-transmitting region block 10 is designed in accordance with this rule and one of examples may be as shown in FIG. 1. For example, in the one light-transmitting region block 10, an arrangement order of 4 light-transmitting regions 11 located in the first row may be ABCD, an arrangement order of 4 light-transmitting regions 11 located in the second row may be BCDA, an arrangement order of 4 light-transmitting regions 11 located in the third row may be CDAB, and an arrangement order of 4 light-transmitting regions 11 located in the fourth row may be DABC; and correspondingly, an arrangement order of 4 light-transmitting regions 11 located in the first column is ABCD, an arrangement order of 4 light-transmitting regions 11 located in the second column is BCDA, an arrangement order of 4 light-transmitting regions 11 located in the third column is CDAB, and an arrangement order of 4 light-transmitting regions 11 located in the fourth row is DABC. In the light-transmitting region block 10, the 4 light-transmitting regions 11 located in the same row are the 4 types of different light-transmitting regions 11, and the 4 light-transmitting regions 11 located in the same column are the 4 types of different light-transmitting regions 11.

It is to be understood by those skilled in the art that designs of arrangement orders of light-transmitting regions in each row and each column in the light-transmitting region block 10 shown in FIG. 1 are merely examples, and other possible designs may also be provided in the embodiments of the present disclosure.

Figure 4:
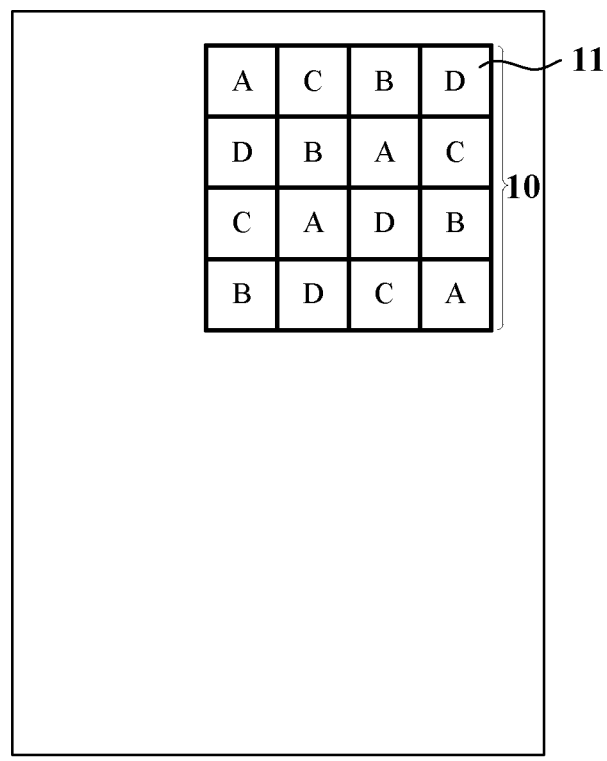
FIG. 4 is a schematic diagram of another display panel according to an embodiment of the present disclosure.

Referring to FIG. 4, a schematic diagram of another display panel according to an embodiment of the present disclosure is provided. A light-transmitting region block 10 shown in FIG. 4 and the light-transmitting region block 10 shown in FIG. 1 may have the same number of types of different light-transmitting regions, but the difference is that an arrangement order of light-transmitting regions in at least one row or at least one column is different. As shown in FIG. 4, in one light-transmitting region block 10, an arrangement order of 4 light-transmitting regions 11 located in the first row may be ACBD, an arrangement order of 4 light-transmitting regions 11 located in the second row may be DBAC, an arrangement order of 4 light-transmitting regions 11 located in the third row may be CADB, and an arrangement order of 4 light-transmitting regions 11 located in the fourth row may be BDCA; and correspondingly, an arrangement order of 4 light-transmitting regions 11 located in the first column is ADCB, an arrangement order of 4 light-transmitting regions 11 located in the second column is CBAD, an arrangement order of 4 light-transmitting regions 11 located in the third column is BADC, and an arrangement order of 4 light-transmitting regions 11 located in the fourth row is DCBA. It can be seen that FIG. 4 illustrates that an arrangement order of light-transmitting regions in a row i is different from an arrangement order of light-transmitting regions in a column j, and values of i and j may be the same or different.

As described above, in the light-transmitting region block 10 of the display panel, 4 light-transmitting regions 11 located in the same row are 4 types of different light-transmitting regions 11, 4 light-transmitting regions 11 located in the same column are 4 types of different light-transmitting regions 11, and any two adjacent light-transmitting regions 11 are different light-transmitting regions 11.

It is to be noted that if the light-transmitting region block of the display panel is formed by the same light-transmitting regions arranged in an array, a plurality of the same light-transmitting regions arranged in the array are equivalent to a grating with fixed spacing and slits. Then, an external grating diffraction effect is easily caused and light-transmitting display of the display panel is affected.

Based on this, in this embodiment, the light-transmitting regions 11 located in the same row or the same column in the light-transmitting region block 10 are different light-transmitting regions 11, that is, adjacent light-transmitting regions 11 are different light-transmitting regions 11. Thus, diffraction can be reduced. The different light-transmitting regions 11 specifically refer to that at least one of a film thickness, a film material, a shape of each of two light-transmitting regions 11, or an arrangement manner of sub-regions in each of the light-transmitting regions 11 is different so that optical paths or phase differences are different when external light passes through the two different light-transmitting regions 11. Then, a fixed grating will not be formed from the adjacent light-transmitting regions 11 in the light-transmitting region block 10, diffraction is avoided when the external light passes through the adjacent light-transmitting regions, and stability of the light-transmitting display of the display panel is enhanced.

If all light-transmitting regions in the display panel are designed in a random manner, design complexity of the display panel is increased on the one hand and probability of occurrence of transparent display defects is increased on the other hand so that a transparent display is not uniform.

In the present application, a solution of the light-transmitting region block is adopted. On the one hand, the design complexity of the display panel is reduced. On the other hand, a diffraction problem in the transparent display is solved, configuration of the light-transmitting region is in a controllable range, the probability of occurrence of transparent display defects is reduced, and uniformity of the transparent display is improved.

Figure 5:
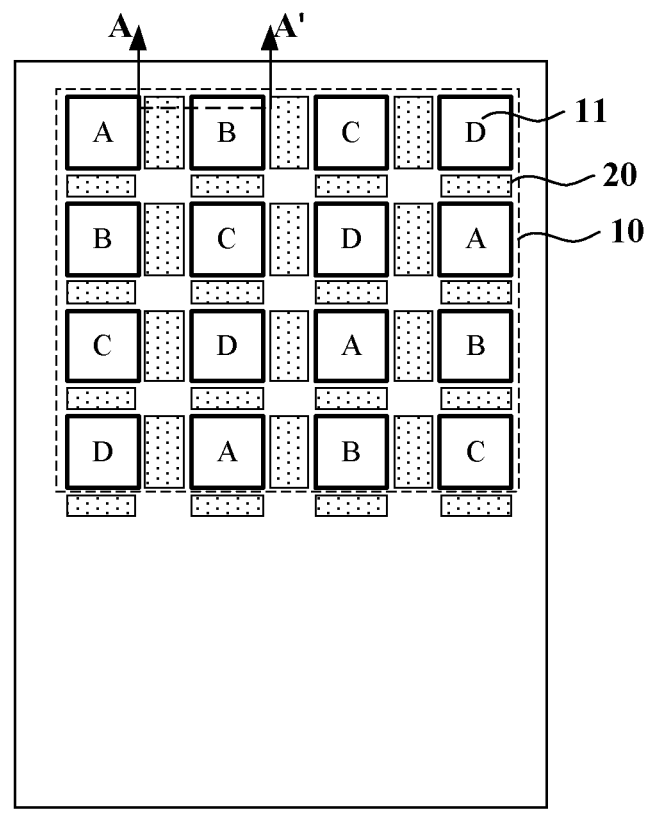
FIG. 5 is a schematic diagram of another display panel according to an embodiment of the present disclosure.

Referring to FIG. 5, a schematic diagram of another display panel according to an embodiment of the present disclosure is provided. As shown in FIG. 5, a display panel further includes a plurality of light-emitting regions 20 provided with light-emitting elements, and the light-emitting elements perform image display in the light-emitting regions 20. Then, the display panel performs the image display through the light-emitting regions 20 and performs the transparent display through a light-transmitting region block 10.

In an embodiment, the light-emitting elements of the display panel located in the light-emitting region 20 may be located between two adjacent light-transmitting regions 11.

One light-emitting element or a plurality of light-emitting elements may be disposed in one light-emitting region 20. If the plurality of light-emitting elements are disposed in the one light-emitting region 20, the plurality of light-emitting elements may include light-emitting elements used for emitting red light, green light, and blue light, respectively.

It is to be understood that a display manner of the display panel which has the light-transmitting region block 10 may be designed to implement image display and transparent display at the same time, that is, an object on the back of the display panel cannot be seen at the position where an image is displayed, and the object on the back of the display panel can be seen at the position where the imaged is not displayed. A display manner of the display panel which has the light-transmitting region block 10 may be designed to implement the image display and the transparent display at different time, that is, the object on the back of the display panel cannot be seen when the image is displayed and the object on the back of the display panel can be seen when the imaged is not displayed.

Figure 6:
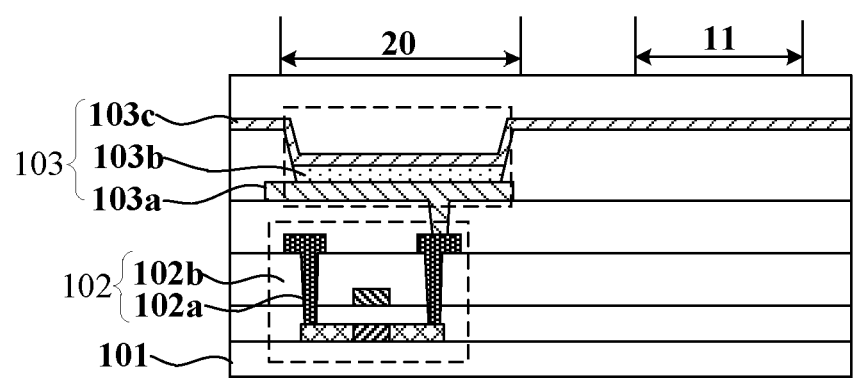
FIG. 6 is a sectional view of FIG. 5 taken along an A-A' direction.

FIG. 6 is a sectional view of FIG. 5 taken along an A-A' direction. As shown in FIG. 6, a display panel includes a base substrate 101 and an array metal layer 102a and an interlayer insulating layer 102b which are located on the base substrate 101. The array metal layer 102a includes at least a gate metal layer and a source-drain metal layer. The gate metal layer and the source-drain metal layer form a plurality of pixel driving circuits 102 including devices such as transistors. The display panel further includes a light-emitting element 103 located on a pixel driving circuit 102. The light-emitting element 103 is electrically connected to the pixel driving circuit 102. The region where the light-emitting element 103 is located is correspondingly the light-emitting region 20 shown in FIG. 5. The pixel driving circuit 102 is used for driving the corresponding light-emitting element 103 to emit light. In an embodiment, the light-emitting element 103 is an organic light-emitting diode. As shown in FIG. 6, the organic light-emitting diode includes an anode 103a, a cathode 103c, and a light-emitting layer 103b located between the anode 103a and the cathode 103c.

Figure 7:
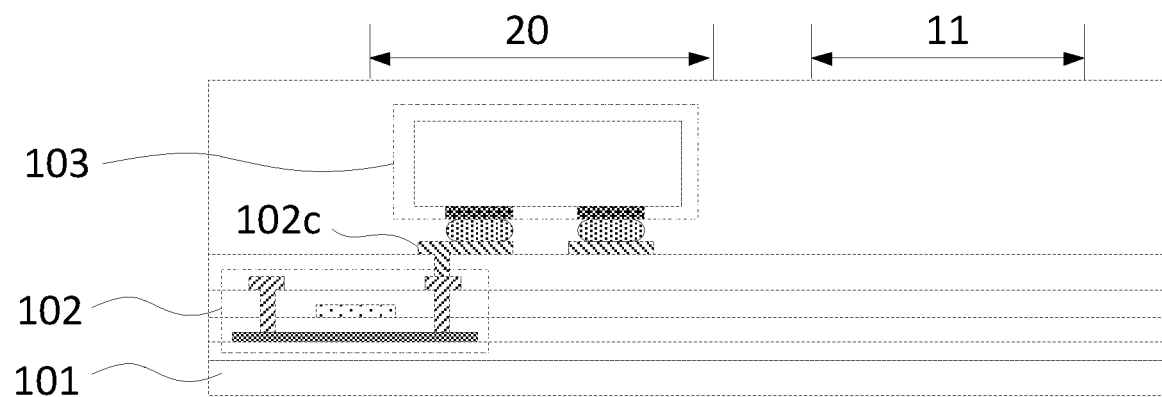
FIG. 7 is another sectional view of FIG. 5 taken along an A-A' direction.

In other embodiments, FIG. 7 is another sectional view of FIG. 5 taken along an A-A' direction. As shown in FIG. 7, in an embodiment, a light-emitting element 103 is an inorganic light-emitting diode, for example, the light-emitting element 103 is a micro-light-emitting diode. For example, a film structure of a display panel may include a base substrate 101 and include a buffer layer, an active layer, a gate insulating layer, a gate metal layer, an interlayer insulating layer, a source-drain metal layer, a passivation layer (or a planarization layer), and a receiving electrode layer 102c successively disposed along the direction in which the base substrate 101 points to the light-emitting element 103. Among the buffer layer, the active layer, the gate insulating layer, the gate metal layer, the interlayer insulating layer, the source-drain metal layer, the passivation layer (or the planarization layer), and the receiving electrode layer 102c, the buffer layer, the gate insulating layer, the interlayer insulating layer, and the passivation layer may be made of inorganic materials, and the planarization layer may be made of organic materials. An electrode of the light-emitting element 103 is electrically connected to the receiving electrode layer 102c through a eutectic layer. The films of the display panel located between the base substrate 101 and the receiving electrode layer 102c form a transistor which forms a pixel driving circuit 102. The pixel driving circuit 102 is used for driving the light-emitting element 103.

With continued reference to FIG. 7, the light-emitting element 103 is disposed in a light-emitting region 20. The display panel further includes a plurality of light-transmitting regions 11. It is to be understood that a structure such as a metal layer of the pixel driving circuit 102 is located between adjacent light-transmitting regions 11 to avoid shielding light outside the light-transmitting regions 11.

FIG. 7 illustrates one film structure of the display panel. The display panel provided by the present application may further include other films. For example, the display panel may further include a baffle wall structure which is around a light-emitting element. The film structure of the display panel provided by the present application may also be a structure obtained after a part of films are removed from the film structure illustrated in FIG. 7.

Figure 8:
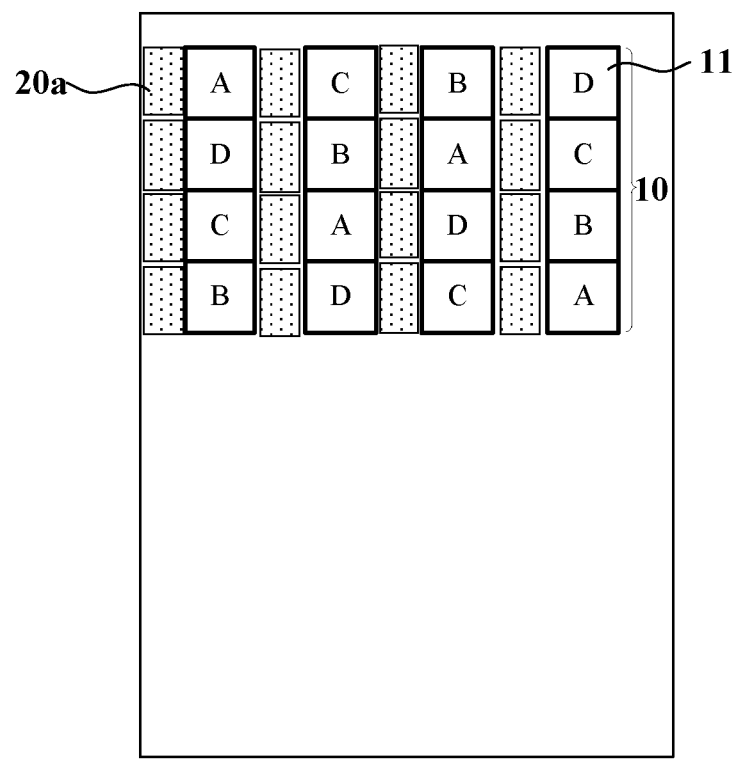
FIG. 8 is a schematic diagram of another display panel according to an embodiment of the present disclosure.

Referring to FIG. 8, a schematic diagram of another display panel according to an embodiment of the present disclosure is provided. As shown in FIG. 8, a display panel further includes a plurality of light-emitting elements 20a for image display. In an embodiment, one column of light-emitting elements 20a of the display panel is located between two adjacent columns of light-transmitting regions 11. The light-transmitting regions 11 are located in the same column, the light-emitting elements 20a are located in the same column, and one column of light-transmitting regions 11 and one column of light-emitting elements 20a are alternately arranged.

Figure 9:
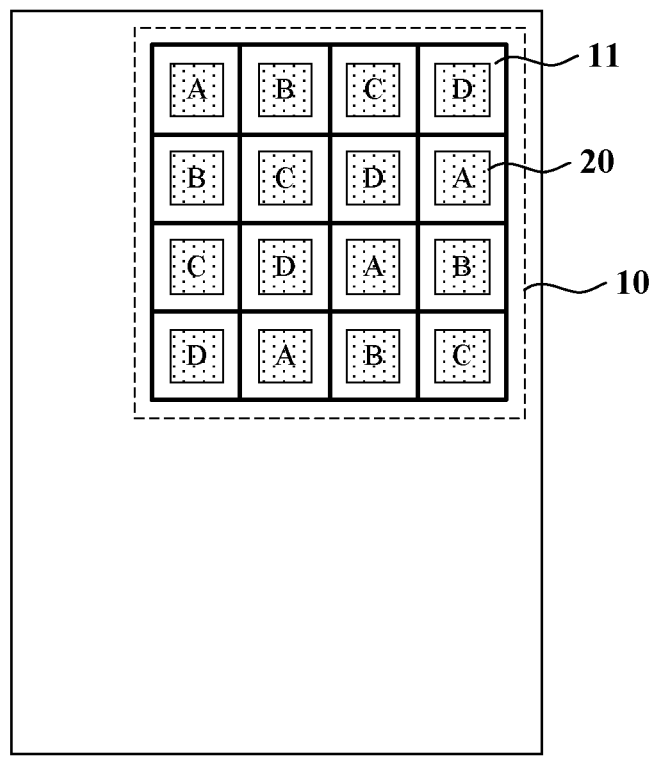
FIG. 9 is a schematic diagram of another display panel according to an embodiment of the present disclosure.

It is to be noted that designs of the light-emitting regions and the light-transmitting regions are not limited to the adjacent arrangement shown in the above figure, but may be other designs. Referring to FIG. 9, a schematic diagram of another display panel according to an embodiment of the present disclosure is provided. As shown in FIG. 9, in an embodiment, a light-transmitting region 11 is disposed around a light-emitting region 20 so that a display panel can perform image display through the light-emitting region 20 and the display panel can also perform transparent display through the light-transmitting region 11.

As described above, the image display is performed in the light-emitting region 20, and external light passes through the light-transmitting region 11 and the transparent display is performed in the light-transmitting region 11. If a light-transmitting region block of the display panel is formed by the same light-transmitting regions arranged in an array, diffraction of the external light is easily caused and a display effect is affected. In this embodiment, in a light-transmitting region block 10, S light-transmitting regions 11 located in the same row are S types of different light-transmitting regions 11, and R light-transmitting regions 11 located in the same column are R types of different light-transmitting regions 11. In this manner, the diffraction of the external light can be reduced. Moreover, interference between the external light and light emitted by the display panel can be prevented, a problem of distortion of the display panel is solved, and the display effect is enhanced.

As described above, the different light-transmitting regions 11 specifically refer to that at least one of a film thickness, a film material, a shape of each of two light-transmitting regions 11, or an arrangement manner of sub-regions in each of the light-transmitting regions 11 is different. The film of the light-transmitting region 11 mentioned here may refer to each of all films located on a base substrate 101 and corresponding to the light-transmitting region 11 or refer to a certain film or each of a plurality of films located on the base substrate 101 and corresponding to the light-transmitting region 11, for example, a base substrate, a buffer layer, a gate insulating layer, an interlayer insulating layer, a passivation layer, and a planarization layer. For example, if thicknesses of films in different light-transmitting regions are different, the following solutions may be adopted: thicknesses of the same film in the different light-transmitting regions are different, or the numbers of films corresponding to the different light-transmitting regions are different, or the thicknesses of the same film in the different light-transmitting regions are different and the numbers of films corresponding to the different light-transmitting regions are also different. The solutions are not limited thereto.

In one light-transmitting region block 10, types of S light-transmitting regions 11 in the same row are different, where film thicknesses of the S light-transmitting regions 11 in the same row are different, or film materials of the S light-transmitting regions 11 in the same row are different, or shapes of the S light-transmitting regions 11 in the same row are different, or arrangement manners of sub-regions in the S light-transmitting regions in the same row are different, or the S light-transmitting regions 11 may be configured through a selection of at least two of the film thickness, the material, the shape, or the arrangement manner of the sub-regions. Similarly, types of R light-transmitting regions 11 in the same column are different, and the solution described above may be adopted.

Figure 10:
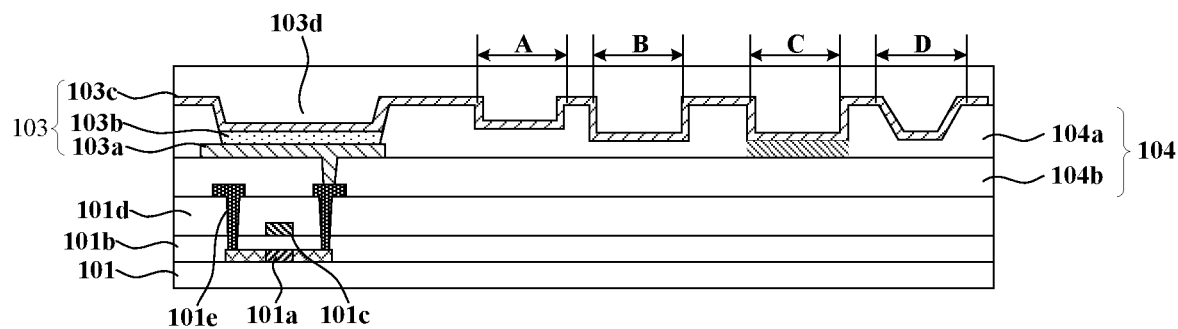
FIG. 10 is a sectional view of FIG. 1 taken along a B-B' direction.

FIG. 10 is a sectional view of FIG. 1 taken along a B-B' direction. Referring to FIG. 10, an arrangement order of light-transmitting regions in one row in one light-transmitting region block is ABCD, where thicknesses of at least one film in a light-transmitting region A and a light-transmitting region B are different, thicknesses and materials of at least one film in the light-transmitting region A and a light-transmitting region C are each different, shapes of the light-transmitting region A and a light-transmitting region D and thicknesses of at least one film in the light-transmitting region A and the light-transmitting region D are each different, materials of at least one film in the light-transmitting region B and the light-transmitting region C are different, shapes of the light-transmitting region B and the light-transmitting region D are different, and shapes of the light-transmitting region C and the light-transmitting region D and materials of at least one film in the light-transmitting region C and the light-transmitting region D are each different. At least one of the film thickness, the film material, the shape of each of adjacent light-transmitting regions, or the arrangement manner of the sub-regions of each of the adjacent light-transmitting regions is different so that optical paths or phase differences are different when external light passes through two different light-transmitting regions. Then, a fixed grating will not be formed from the adjacent light-transmitting regions in the light-transmitting region block, and diffraction of the external light is avoided.

As shown in FIG. 10, a display panel includes at least a base substrate 101, an active layer 101a, a gate insulating layer 101b, a first metal layer 101c, an interlayer insulating layer 101d, a second metal layer 101e, a passivation layer or a planarization layer 104b, a first pixel electrode 103a, a light-emitting layer 103b, a second pixel electrode 103c, a pixel defining layer 104a, and an encapsulation layer 103d. The pixel defining layer 104a is used as an example. The thickness of the pixel defining layer corresponding to the light-transmitting region A is different from the thickness of the pixel defining layer corresponding to the light-transmitting region B, or the material of the pixel defining layer corresponding to the light-transmitting region B is different from the material of the pixel defining layer corresponding to the light-transmitting region C, or the shape of the pixel defining layer corresponding to the light-transmitting region B is different from the shape of the pixel defining layer corresponding to the light-transmitting region D.

In an embodiment, a display panel further includes a substrate; a first film located on the substrate; and different light-transmitting regions, where at least one of the following cases exists: case 1), the first films have different thicknesses; case 2), the first films are made of different materials; or case 3), the first film comprises at least two sub-films stacked, and thickness ratios of the at least two sub-films of first films are different.

Differences in thicknesses of the first film may include cases described below. Case one: the first film is a monolayer film, thicknesses of the monolayer film in different light-transmitting regions are different, the monolayer film may be manufactured by a halftone mask process to form the different thicknesses in the different light-transmitting regions, and the monolayer film may be made of an organic material; case two: the first film is a multilayer stacked film, the first film includes different numbers of films in the different light-transmitting regions so that thicknesses of the first film in the different light-transmitting regions are different, and materials of the films included by the first film may include inorganic materials and organic materials; and case three: films in the first film include the monolayer film which is of the different thicknesses in the different light-transmitting regions and the multilayer film which has the different numbers of films in the different light-transmitting regions.

Differences in materials of the first film may include cases described below. Case one: the first films are made of different inorganic materials in the different light-transmitting regions, for example, the different inorganic materials are silicon oxide and silicon nitride, respectively; and case two: the first films are made of the organic materials and the inorganic materials in the different light-transmitting regions.

The first film includes the at least two sub-films stacked and the thickness ratios of the at least two sub-films are different. For example, the first film includes a first sub-film and a second sub-film which are stacked, and the light-transmitting region includes a first light-transmitting region and a second light-transmitting region, where a thickness of the first sub-film in the first light-transmitting region is greater than a thickness of the first sub-film in the second light-transmitting region, and a thickness of the second sub-film in the first light-transmitting region is less than a thickness of the second sub-film in the second light-transmitting region.

In an embodiment, the light-transmitting region includes at least two sub-regions and structures of the at least two sub-regions are different; and in different light-transmitting regions, arrangement manners of the sub-regions are different. A difference in the structures of the sub-regions described here refers to that thicknesses of the first films of the two sub-regions are different, or materials of the first films of the two sub-regions are different, or thickness ratios of sub-films in the first films of the two sub-regions are different, or shapes of the two sub-regions are different.

Figure 11:
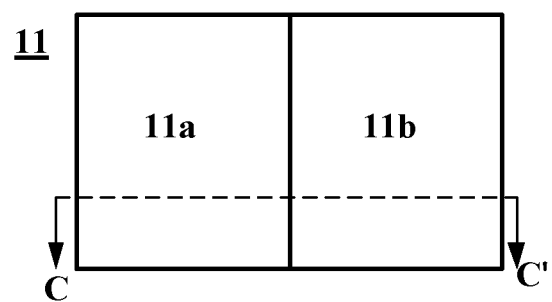
FIG. 11 is a schematic diagram of a light-transmitting region according to an embodiment of the present disclosure.
Figure 12:
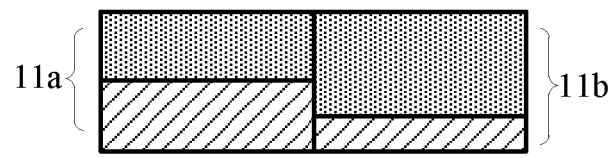
FIG. 12 is a sectional view of FIG. 11 taken along a C-C' direction.

Referring to FIG. 11, a schematic diagram of a light-transmitting region according to an embodiment of the present disclosure is provided. FIG. 12 is a sectional view of FIG. 11 taken along a C-C' direction. In conjunction with FIGS. 11 and 12, a light-transmitting region 11 includes at least two sub-regions 11a and 11b and structures of the sub-region 11a and the sub-region 11b are different. In an embodiment, thicknesses of at least one film in the sub-region 11a and the sub-region 11b are different, or in an embodiment, thickness ratios of at least two films in the sub-region 11a and the sub-region 11b are different.

Figure 13:
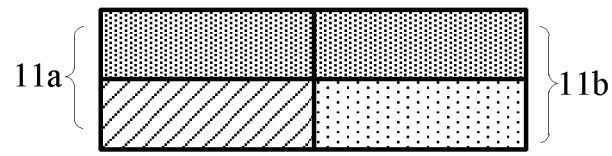
FIG. 13 is another sectional view of FIG. 11 taken along a C-C' direction.

FIG. 13 is another sectional view of FIG. 11 taken along a C-C' direction. In conjunction with FIGS. 11 and 13, a light-transmitting region includes at least two sub-regions 11a and 11b and structures of the sub-region 11a and the sub-region 11b are different. In an embodiment, materials of at least one film in the sub-region 11a and the sub-region 11b are different.

Figure 14:
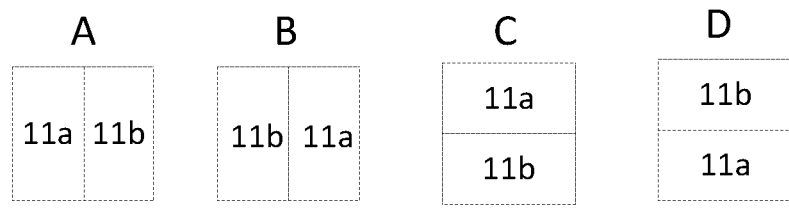
FIG. 14 is a schematic diagram of another light-transmitting region according to an embodiment of the present disclosure.

Referring to FIG. 14, a schematic diagram of four types of light-transmitting regions according to an embodiment of the present disclosure is provided. A light-transmitting region includes at least two sub-regions. FIG. 14 illustrates an example in which the light-transmitting region includes two sub-regions 11a and 11b having different structures. Sub-regions are arranged in different manners so that different light-transmitting regions can be formed. Arrangement manners of four types of light-transmitting regions (A-D) are illustrated in FIG. 14. In a light-transmitting region A, the sub-region 11a is on the left and the sub-region 11b is on the right; in a light-transmitting region B, the sub-region 11a is on the right and the sub-region 11b is on the left; in a light-transmitting region C, the sub-region 11a is on the top and the sub-region 11b is at the bottom; and in a light-transmitting region D, the sub-region 11a is at the bottom and the sub-region 11b is on the top. It is to be understood that the illustrated arrangement described here is the top view of the light-transmitting region. Positions such as "top", "bottom", "left", and "right" refer to the positions such as "top", "bottom", "left", and "right" viewed by human eyes from the top view.

The light-transmitting regions formed by the sub-regions differ in the arrangement manners of the sub-regions. Therefore, a diffraction problem is solved, transmittance consistency of the light-transmitting regions can be improved, and a transparent display effect is improved.

Figure 15:
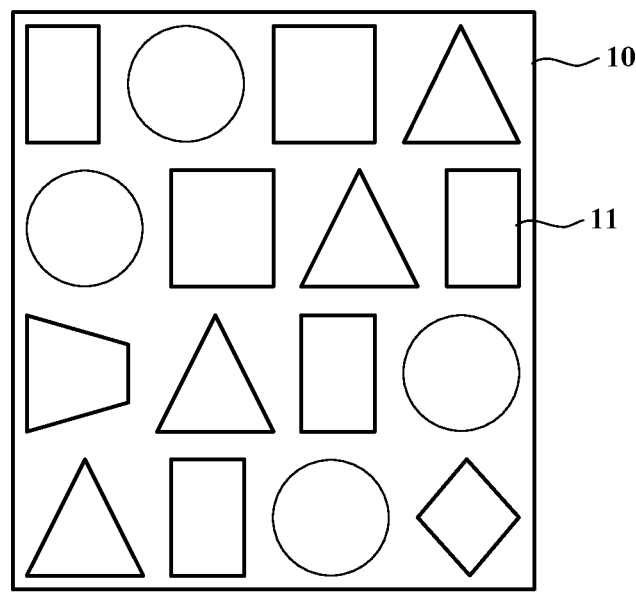
FIG. 15 is a schematic diagram of a light-transmitting region block according to an embodiment of the present disclosure.

In an embodiment, shapes of the different light-transmitting regions are different. A shape of a light-transmitting region described here can be understood as an orthographic projection of the light-transmitting region on a base substrate. Referring to FIG. 15, a schematic diagram of a light-transmitting region block according to an embodiment of the present disclosure is provided. As shown in FIG. 15, a shape of a light-transmitting region 11 in a light-transmitting region block 10 may be a rectangle, a square, a circle, a triangle, a trapezoid, or a rhombus. It is to be understood that two adjacent light-transmitting regions have different film structures or different shape structures.

It is to be noted that areas of different light-transmitting regions may be the same or different. For example, as shown in FIG. 15, the light-transmitting region block 10 includes a triangular light-transmitting region and a rectangular light-transmitting region which have the same area. The two light-transmitting regions are of different shapes so that formation of a fixed grating from adjacent light-transmitting regions can be avoided.

Referring to FIGS. 1 and 4, in an embodiment, in the one light-transmitting region block 10, for light-transmitting regions 11 located in two adjacent rows, types of light-transmitting regions located in one of the two adjacent rows are the same as types of light-transmitting regions located in the other one of two adjacent rows.

In this embodiment, types of the light-transmitting regions 11 located in the two adjacent rows in the light-transmitting region block 10 are the same. For example, the display panel includes the at least 4 types of different light-transmitting regions 11 which are the light-transmitting region A, the light-transmitting region B, the light-transmitting region C, and the light-transmitting region D, respectively. Each row in the light-transmitting region block 10 includes the 4 light-transmitting regions 11. Thus, in an embodiment, types of light-transmitting regions 11 in each row in the light-transmitting region block 10 include A, B, C, and D. Arrangement manners of the light-transmitting regions 11 in each row in the light-transmitting region block 10 are different.

Referring to FIG. 1, in the light-transmitting region block 10, arrangement orders of light-transmitting regions 11 in four rows are ABCD, BCDA, CDAB, and DABC, respectively; and correspondingly, arrangement orders of light-transmitting regions 11 in four columns are ABCD, BCDA, CDAB, and DABC, respectively. Then, in the light-transmitting region block 10, the light-transmitting regions 11 located in the same row are different from each other, and the light-transmitting regions 11 located in the same column are different from each other.

Referring to FIG. 4, in the light-transmitting region block 10, arrangement orders of light-transmitting regions 11 in four rows are ACBD, DBAC, CADB, and BDCA, respectively; and correspondingly, arrangement orders of light-transmitting regions 11 in four columns are ADCB, CBAD, BADC, and DCBA, respectively. Then, in the light-transmitting region block 10, the light-transmitting regions 11 located in the same row are different from each other, and the light-transmitting regions 11 located in the same column are different from each other.

It is to be understood that arrangement orders of all light-transmitting regions in the light-transmitting region block illustrated above are merely one or more examples, and the arrangement order is not limited thereto in actual manufacture.

In this embodiment, in the one light-transmitting region block, the adjacent light-transmitting regions are different and a fixed grating will not be formed in the light-transmitting region block so that optical paths or phase differences are different when external light passes through two different light-transmitting regions. In this manner, diffraction is avoided when the external light passes through the adjacent light-transmitting regions, and stability of light-transmitting display of the display panel is enhanced. In addition, in the two adjacent rows, the types of the light-transmitting regions located in one of the two adjacent rows are the same as the types of the light-transmitting regions located in the other one of two adjacent rows. Thus, the limited number of types of the light-transmitting regions can be adopted to design the light-transmitting region block meeting requirements, and design difficulty is reduced. Additionally, since the same types of light-transmitting regions are adopted in the two adjacent rows, a difference degree of the light-transmitting regions in the same light-transmitting region block is reduced, and display uniformity is improved.

In an embodiment, in the one light-transmitting region block, for the light-transmitting regions located in the two adjacent rows, the types of the light-transmitting regions located in one of the two adjacent rows include at least one type different from the types of the light-transmitting regions located in the other one of the two adjacent rows.

A display panel includes N types of different light-transmitting regions. In an embodiment, N is greater than R or N is greater than S. In one light-transmitting region block, S light-transmitting regions in one row are the S light-transmitting regions among the N types of different light-transmitting regions, and R light-transmitting regions in one column are the R light-transmitting regions among the N types of different light-transmitting regions. For example, N is greater than S. The S light-transmitting regions in the one row in the light-transmitting region block are the S light-transmitting regions among the N types of different light-transmitting regions. Thus, types of light-transmitting regions in two adjacent rows in the one light-transmitting region block may be the same or different.

Figure 16:
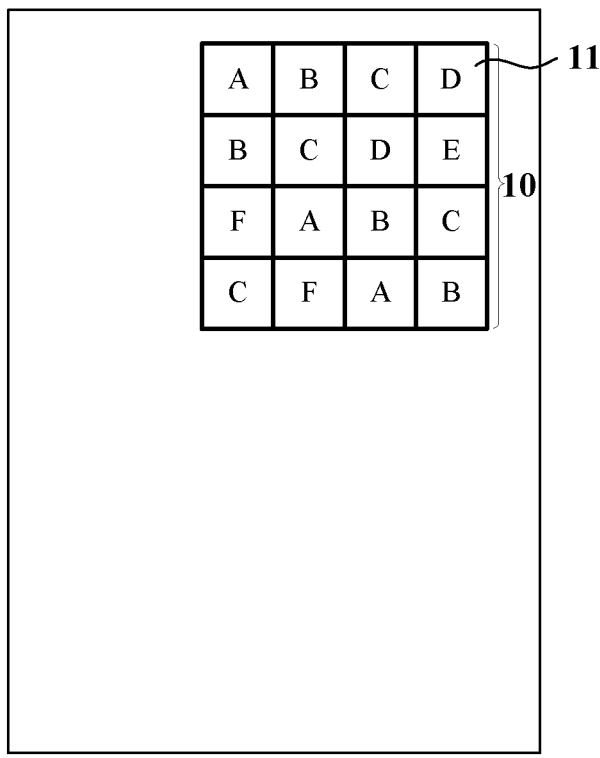
FIG. 16 is a schematic diagram of another display panel according to an embodiment of the present disclosure.

Referring to FIG. 16, a schematic diagram of another display panel according to an embodiment of the present disclosure is provided. As shown in FIG. 16, in one light-transmitting region block 10, for light-transmitting regions 11 located in two adjacent rows, types of light-transmitting regions 11 located in one of the two adjacent rows are not exactly the same as types of light-transmitting regions 11 located in the other one of two adjacent rows. For example, a display panel includes at least 6 types of different light-transmitting regions which are a light-transmitting region A, a light-transmitting region B, a light-transmitting region C, a light-transmitting region D, a light-transmitting region E, and a light-transmitting region F, respectively. Each row in the light-transmitting region block 10 includes 4 light-transmitting regions 11. Thus, in an embodiment, in the light-transmitting region block 10, arrangement orders of light-transmitting regions 11 in four rows are ABCD, BCDE, FABC, and CFAB, respectively; and correspondingly, arrangement orders of light-transmitting regions 11 in four columns are ABFC, BCAF, CDBA, and DECB, respectively. In the light-transmitting region block 10, types of light-transmitting regions 11 in the first row and the second row are not exactly the same, and three same types exist and are B, C, and D, respectively; types of light-transmitting regions 11 in the second row and the third row are not exactly the same, and two same types exist and are B and C, respectively; and types of light-transmitting regions 11 in the third row and the fourth row are exactly the same and are A, B, C, and F.

Figure 17:
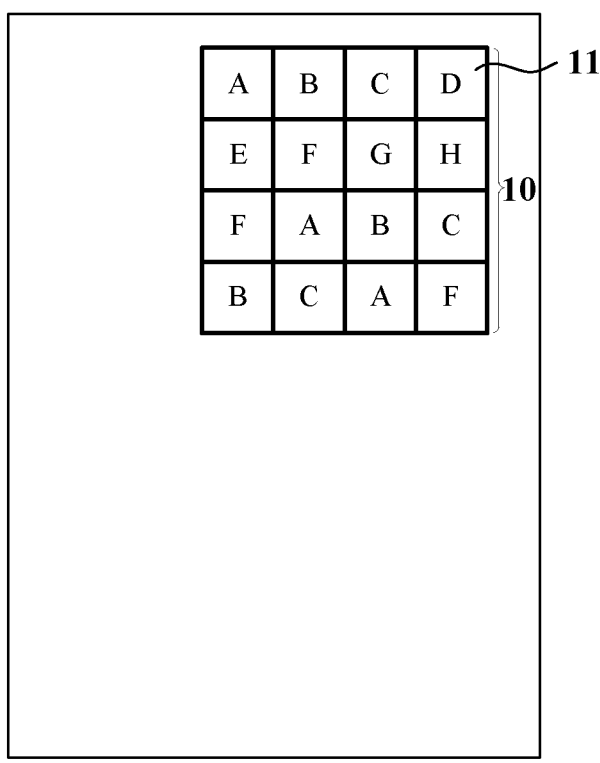
FIG. 17 is a schematic diagram of another display panel according to an embodiment of the present disclosure.

Referring to FIG. 17, a schematic diagram of another display panel according to an embodiment of the present disclosure is provided. As shown in FIG. 17, in one light-transmitting region block 10, for light-transmitting regions 11 located in two adjacent rows, types of light-transmitting regions 11 located in one of the two adjacent rows are completely different from types of light-transmitting regions 11 located in the other one of two adjacent rows. For example, a display panel includes at least 8 types of different light-transmitting regions which are a light-transmitting region A, a light-transmitting region B, a light-transmitting region C, a light-transmitting region D, a light-transmitting region E, a light-transmitting region F, a light-transmitting region G, and a light-transmitting region H, respectively. Each row in the light-transmitting region block 10 includes 4 light-transmitting regions 11. Thus, in an embodiment, in the light-transmitting region block 10, arrangement orders of light-transmitting regions 11 in four rows are ABCD, EFGH, FABC, and BCAF, respectively; and correspondingly, arrangement orders of light-transmitting regions 11 in four columns are AEFB, BFAC, CGBA, and DHCF, respectively. In the light-transmitting region block 10, types of light-transmitting regions 11 in the first row and the second row are completely different; types of light-transmitting regions 11 in the second row and the third row are not exactly the same, and one same type exists and is F; and types of light-transmitting regions 11 in the third row and the fourth row are exactly the same and are A, B, C, and F.

It is to be understood that arrangement orders of light-transmitting regions in all rows in the light-transmitting region block illustrated above are merely one or more examples, and the arrangement order is not limited thereto in actual manufacture. For example, in one light-transmitting region block, types of light-transmitting regions in any two adjacent rows are not exactly the same; or in one light-transmitting region block, types of light-transmitting regions in any two adjacent rows are completely different; or in one light-transmitting region block, types of light-transmitting regions in at least two adjacent rows are not exactly the same or completely different. The relevant practitioners may properly design the light-transmitting region blocks according to product or process limitations.

In this embodiment, in the two adjacent rows, the types of the light-transmitting regions located in one of the two adjacent rows include at least one type different from the types of the light-transmitting regions located in the other one of the two adjacent rows. In this manner, different types of light-transmitting regions can be adopted, more different types of light-transmitting regions can be flexibly designed, the number of types of the light-transmitting regions is increased, diffraction is further reduced, and a display effect is improved.

In an embodiment, the number of light-transmitting region blocks is at least two; and types of adjacent light-transmitting regions respectively located in two adjacent light-transmitting region blocks are different.

Figure 18:
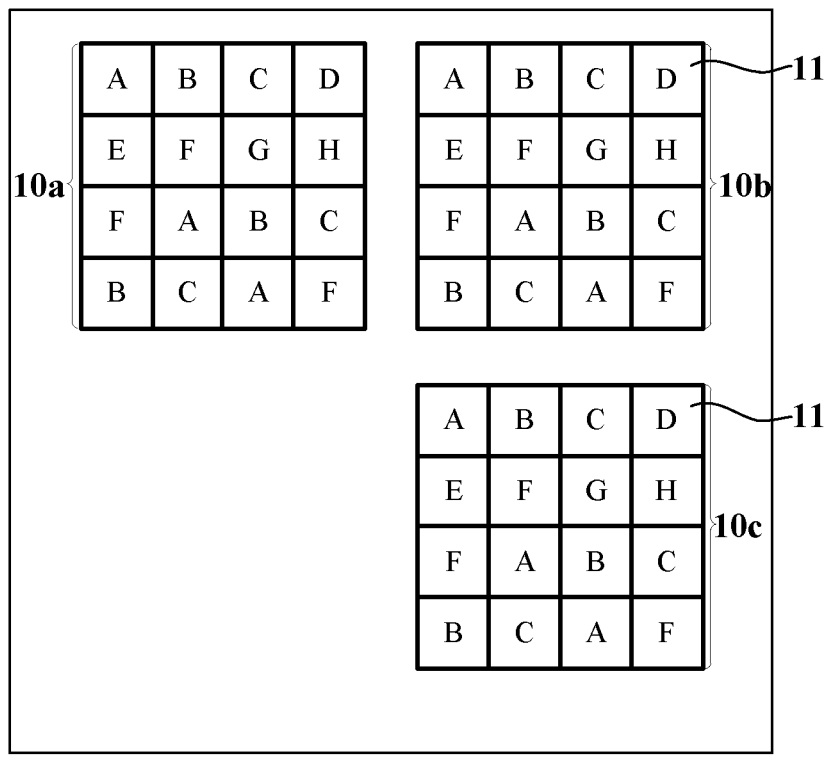
FIG. 18 is a schematic diagram of another display panel according to an embodiment of the present disclosure.

Referring to FIG. 18, a schematic diagram of another display panel according to an embodiment of the present disclosure is provided. As shown in FIG. 18, in an embodiment, a display panel includes 2 or more light-transmitting region blocks described above. For two adjacent light-transmitting region blocks 10, types of adjacent light-transmitting regions 11 located in the two adjacent light-transmitting region blocks 10 are different.

As shown in FIG. 18, a light-transmitting region block 10a and a light-transmitting region block 10b are disposed adjacent to each other in a row direction. Thus, light-transmitting regions 11 in the fourth column in the light-transmitting region block 10a and light-transmitting regions 11 in the first column in the light-transmitting region block 10b are disposed adjacent to each other. An arrangement order of the light-transmitting regions 11 in the fourth column in the light-transmitting region block 10a is DHCF, and an arrangement order of the light-transmitting regions 11 in the first column in the light-transmitting region block 10b is AEFB. The light-transmitting regions 11 in the fourth column in the light-transmitting region block 10a and the light-transmitting regions 11 in the first column in the light-transmitting region block 10b disposed adjacent to each other are each of different types. Thus, a fixed grating will not be formed from the adjacent light-transmitting regions in the adjacent light-transmitting region blocks, and diffraction is avoided when external light passes through the adjacent light-transmitting region blocks.

As shown in FIG. 18, a light-transmitting region block 10b and a light-transmitting region block 10c are disposed adjacent to each other in a column direction. Thus, light-transmitting regions 11 in the fourth row in the light-transmitting region block 10b and light-transmitting regions 11 in the first row in the light-transmitting region block 10c are disposed adjacent to each other. An arrangement order of the light-transmitting regions 11 in the fourth row in the light-transmitting region block 10b is BCAF, and an arrangement order of the light-transmitting regions 11 in the first row in the light-transmitting region block 10c is ABCD. The light-transmitting regions 11 in the fourth row in the light-transmitting region block 10b and the light-transmitting regions 11 in the first row in the light-transmitting region block 10c disposed adjacent to each other are each of different types. Thus, a fixed grating will not be formed from the adjacent light-transmitting regions in the adjacent light-transmitting region blocks, and diffraction is avoided when external light passes through the adjacent light-transmitting region blocks.

Based on this, when the arrangement is performed in units of light-transmitting region blocks 10, diffraction between the adjacent light-transmitting region blocks 10 can be reduced and the arrangement of the light-transmitting region blocks 10 is simplified.

It is to be understood that the plurality of light-transmitting region blocks illustrated above is merely one example on the basis of ensuring that the types of the adjacent light-transmitting regions located in the two adjacent light-transmitting region blocks are different. In this embodiment, the plurality of light-transmitting region blocks may be exactly the same. However, in other embodiments, a display panel includes a plurality of types of different light-transmitting region blocks and adjacent light-transmitting region blocks may be of the same type or different types, which is not limited thereto in actual manufacture. The relevant practitioners may properly design light-transmitting region blocks according to product or process limitations.

In an embodiment, the number of light-transmitting region blocks is at least two; and the at least two light-transmitting region blocks are the same type of light-transmitting region blocks. In this embodiment, the display panel includes a plurality of light-transmitting region blocks. The plurality of light-transmitting region blocks may be a plurality of light-transmitting region blocks of the same type, or the plurality of light-transmitting region blocks may be a plurality of light-transmitting region blocks of different types, or the plurality of light-transmitting region blocks may be a plurality of light-transmitting region blocks of different types, and some of the light-transmitting region blocks are the same type of light-transmitting region blocks.

The same type of light-transmitting region blocks refers to that arrangements of light-transmitting regions in two light-transmitting region blocks are exactly the same, that is, for two light-transmitting region blocks of the same type in a display panel, after one of the two light-transmitting region blocks is moved, the one light-transmitting region block and the other light-transmitting region block may have exactly the same structures such as shapes of light-transmitting regions, arrangements of light-transmitting regions, film thicknesses, and film materials. Conversely, two light-transmitting region blocks may be considered to be of different types if a difference in the arrangements of light-transmitting regions exists.

Referring to FIG. 18, an arrangement of the light-transmitting regions 11 in the light-transmitting region block 10a is exactly the same as an arrangement of the light-transmitting regions 11 in the light-transmitting region block 10b. When the light-transmitting region block 10a is moved to the position where the light-transmitting region block 10b is located, the light-transmitting region block 10a and the light-transmitting region block 10b can completely overlap each other in structures such as films and shapes so that the light-transmitting region block 10a and the light-transmitting region block 10b are the same type of light-transmitting region blocks. In this embodiment, the at least two light-transmitting region blocks are the same type of light-transmitting region blocks so that manufacture difficulty can be reduced.

In an embodiment, the number of light-transmitting region blocks is X*Y, the X*Y light-transmitting region blocks are arranged in an array of X rows and Y columns, X is an integer greater than or equal to 2, and Y is an integer greater than or equal to 2; and the X*Y light-transmitting region blocks are the same type of light-transmitting region blocks.

Figure 19:
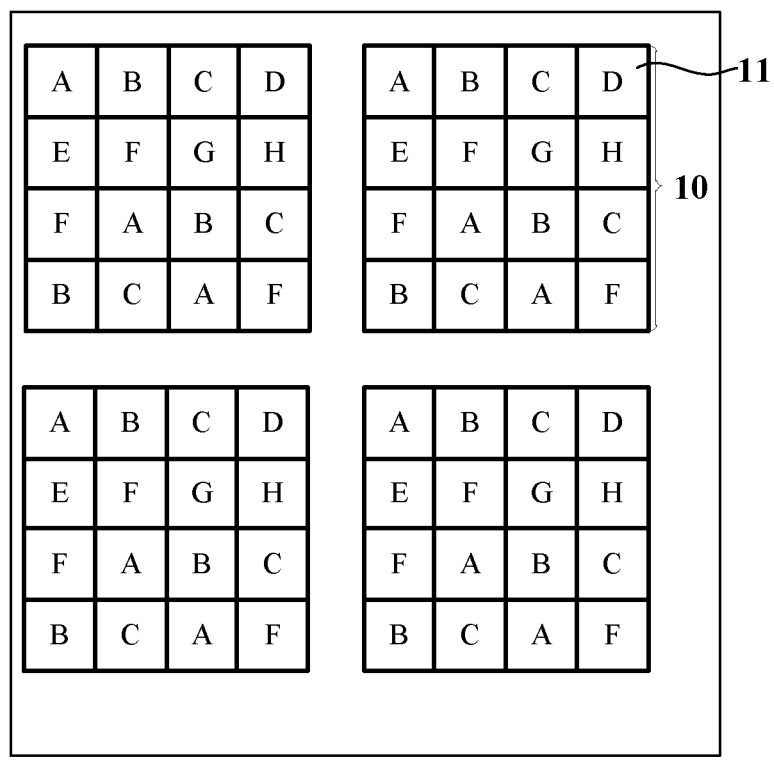
FIG. 19 is a schematic diagram of another display panel according to an embodiment of the present disclosure.

Referring to FIG. 19, a schematic diagram of another display panel according to an embodiment of the present disclosure is provided. As shown in FIG. 19, in a display panel, the number of light-transmitting region blocks 10 is X*Y, the X*Y light-transmitting region blocks 10 are arranged in an array of X rows and Y columns, and the X*Y light-transmitting region blocks 10 are the same type of light-transmitting region blocks 10. In each light-transmitting region block 10, S light-transmitting regions 11 located in the same row are different light-transmitting regions 11, and R light-transmitting regions 11 located in the same column are different light-transmitting regions 11 so that a fixed grating will not be formed in the light-transmitting region block 10 and diffraction of external light in the light-transmitting region block 10 is avoided. In addition, types of adjacent light-transmitting regions 11 located in two adjacent light-transmitting region blocks 10 respectively are different. Thus, a fixed grating will not be formed from the adjacent light-transmitting region blocks 10, diffraction of external light between the adjacent light-transmitting region blocks 10 is avoided, and stability of light-transmitting display of the display panel is enhanced. In addition, same type of light-transmitting region blocks 10 in the display panel are arranged in an array so that process and manufacture difficulty can be reduced.

Figure 20:
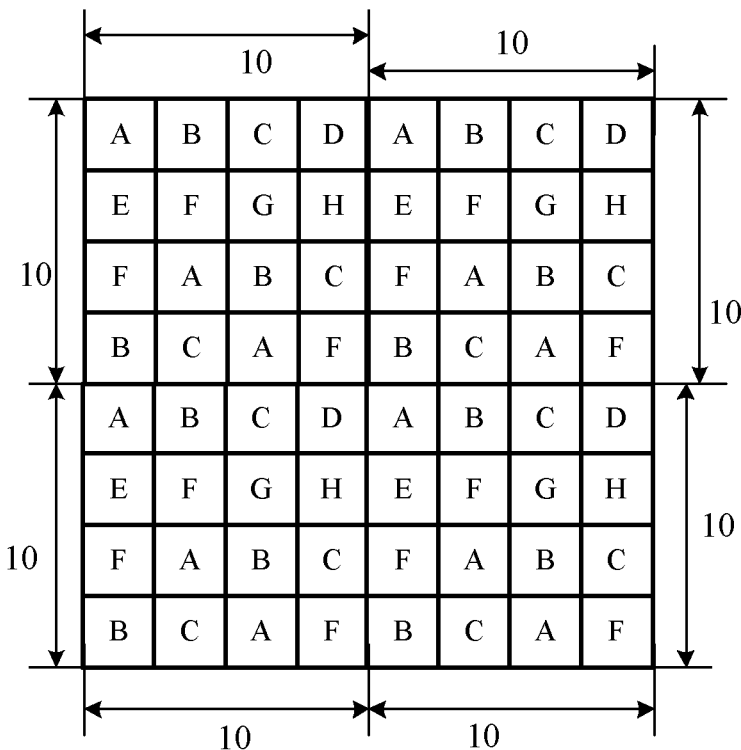
FIG. 20 is a schematic diagram of another display panel according to an embodiment of the present disclosure.

It is to be noted that spacing is designed to exist between the adjacent light-transmitting region blocks in the above illustration, and the spacing is larger than spacing between two adjacent light-transmitting regions in the light-transmitting region blocks. It is to be understood that the above illustration is merely an example. In order to better distinguish light-transmitting region blocks, the relevant practitioner can properly design spacing between the light-transmitting region blocks and the spacing between the two adjacent light-transmitting regions in the light-transmitting region blocks according to product requirements. In other embodiments, referring to FIG. 20, a schematic diagram of another display panel according to an embodiment of the present disclosure is provided. As shown in FIG. 20, a display panel includes 4 light-transmitting region blocks 10 disposed adjacent to each other and no spacing exists between adjacent light-transmitting region blocks 10.

In an embodiment, the number of light-transmitting region blocks is at least two; and the at least two light-transmitting region blocks are different types of light-transmitting region blocks. In this embodiment, the display panel includes M types of different light-transmitting region blocks, and M is an integer greater than or equal to 2. The same type of light-transmitting region blocks refers to that arrangements of light-transmitting regions in two light-transmitting region blocks are exactly the same. Conversely, two light-transmitting region blocks are considered to be of different types if a difference exists in the arrangements of light-transmitting regions in the two light-transmitting regions blocks.

Referring to FIGS. 16 and 17, an arrangement manner of light-transmitting regions 11 in at least one column in a light-transmitting region block 10 in FIG. 16 is different from an arrangement manner of light-transmitting regions 11 in at least one column in the light-transmitting region block 10 in FIG. 17, or an arrangement manner of light-transmitting regions 11 in at least one row in a light-transmitting region block 10 in FIG. 16 is different from an arrangement manner of light-transmitting regions 11 in at least one row in a light-transmitting region block 10 in FIG. 17. Thus, the light-transmitting region block 10 illustrated in FIG. 16 and the light-transmitting region block 10 illustrated in FIG. 17 are different types of light-transmitting region blocks 10.

Referring to FIG. 19, arrangement manners of light-transmitting regions 11 in all light-transmitting region blocks 10 in FIG. 19 are exactly the same. Thus, 4 light-transmitting region blocks 10 illustrated in FIG. 19 are the same type of light-transmitting region blocks 10.

Figure 21:
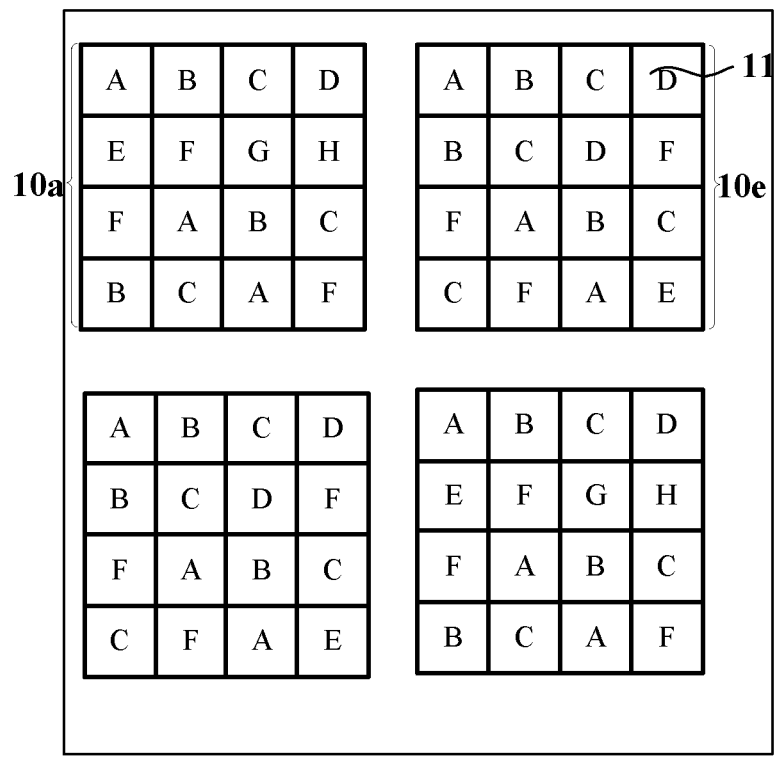
FIG. 21 is a schematic diagram of another display panel according to an embodiment of the present disclosure.

Referring to FIG. 21, a schematic diagram of another display panel according to an embodiment of the present disclosure is provided. As shown in FIG. 21, in an embodiment, a display panel includes at least two types of different light-transmitting region blocks labelled as a light-transmitting region block 10a and a light-transmitting region block 10e, respectively. The display panel includes at least 8 types of different light-transmitting regions which are a light-transmitting region A, a light-transmitting region B, a light-transmitting region C, a light-transmitting region D, a light-transmitting region E, a light-transmitting region F, a light-transmitting region G, and a light-transmitting region H, respectively. In an embodiment, R=S=4.

In the light-transmitting region block 10a, arrangement orders of light-transmitting regions 11 in four rows are ABCD, EFGH, FABC, and BCAF, respectively; and correspondingly, arrangement orders of light-transmitting regions 11 in four columns are AEFB, BFAC, CGBA, and DHCF, respectively. In the light-transmitting region block 10e, arrangement orders of light-transmitting regions 11 in four rows are ABCD, BCDE, FABC, and CFAE, respectively; and correspondingly, arrangement orders of light-transmitting regions 11 in four columns are ABFC, BCAF, CDBA, and DFCE, respectively. In an embodiment, at least two adjacent light-transmitting region blocks are different types of light-transmitting region blocks.

In the light-transmitting region block 10 in the display panel, S light-transmitting regions 11 located in the same row are different light-transmitting regions 11, and R light-transmitting regions 11 located in the same column are different light-transmitting regions 11. Thus, a fixed grating will not be formed in the light-transmitting region block, and diffraction of external light in the light-transmitting region block is avoided. In addition, types of adjacent light-transmitting regions 11 in two adjacent light-transmitting region blocks are different. Thus, a fixed grating will not be formed from the adjacent light-transmitting region blocks, and diffraction of external light between the adjacent light-transmitting region blocks is avoided. In this manner, stability of light-transmitting display of the display panel is enhanced.

In an embodiment, different types of light-transmitting region blocks have the same types of light-transmitting regions and have different arrangement rules.

Figures 22, 23:
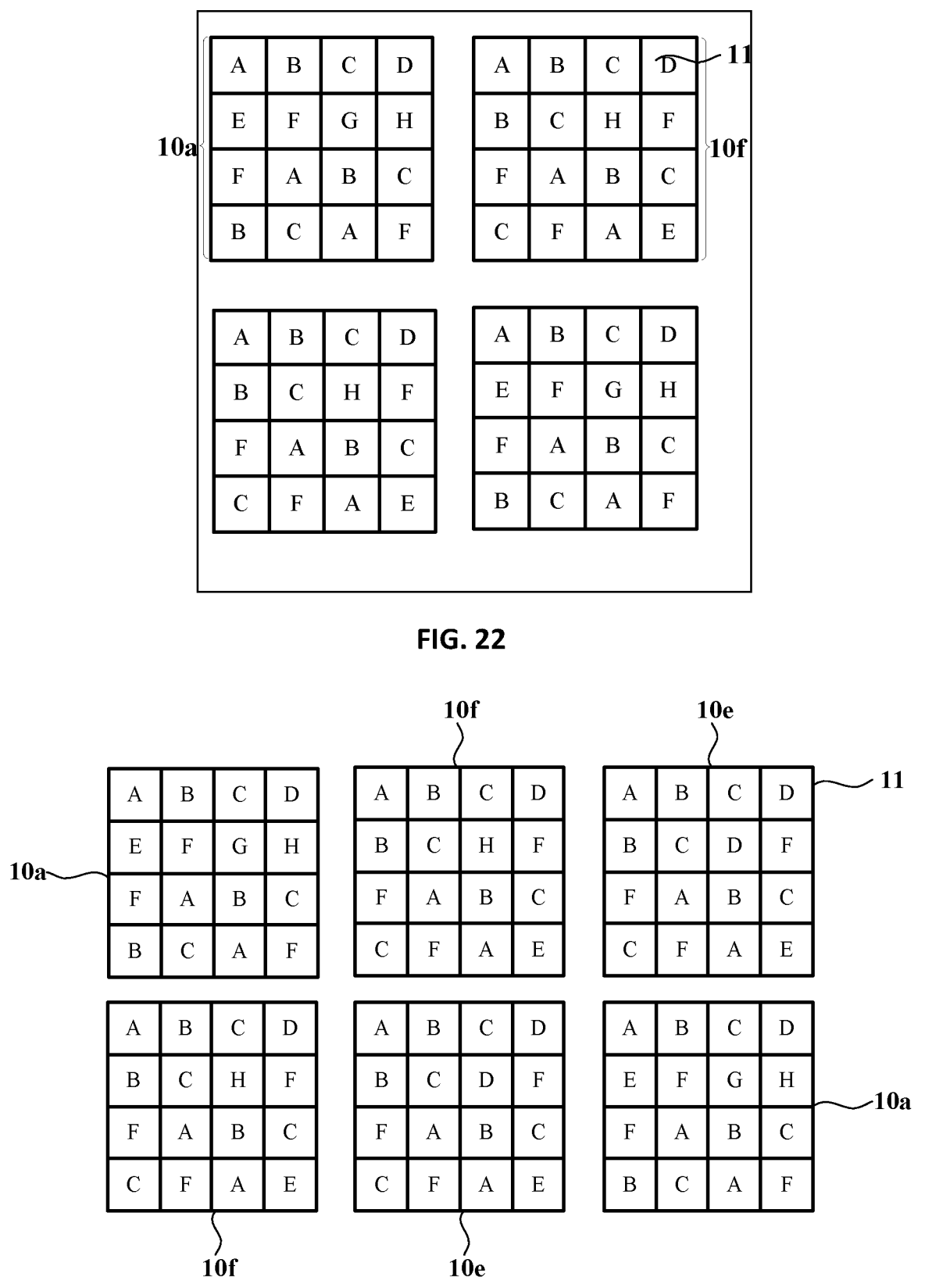

Referring to FIG. 22, a schematic diagram of another display panel according to an embodiment of the present disclosure is provided. As shown in FIG. 22, in an embodiment, a display panel includes at least 2 types of different light-transmitting region blocks 10a and 10f. The light-transmitting region block 10a and the light-transmitting region block 10f each include 8 types of different light-transmitting regions 11 which are a light-transmitting region A, a light-transmitting region B, a light-transmitting region C, a light-transmitting region D, a light-transmitting region E, a light-transmitting region F, a light-transmitting region G, and a light-transmitting region H, respectively. A difference between the light-transmitting region block 10a and the light-transmitting region block 10f is that arrangement rules of light-transmitting regions 11 in the two light-transmitting region blocks are different.

In an embodiment, R=S=4. In an embodiment, in the light-transmitting region block 10a, arrangement orders of light-transmitting regions 11 in four rows are ABCD, EFGH, FABC, and BCAF, respectively; and correspondingly, arrangement orders of light-transmitting regions 11 in four columns are AEFB, BFAC, CGBA, and DHCF, respectively. In the light-transmitting region block 10f, arrangement orders of light-transmitting regions 11 in four rows are ABCD, BCHF, FABC, and CFAE, respectively; and correspondingly, arrangement orders of light-transmitting regions 11 in four columns are ABFC, BCAF, CHBA, and DFCE, respectively.

The display panel includes a plurality of light-transmitting region blocks of different types. A fixed grating will not be formed in the light-transmitting region block, diffraction of external light between adjacent light-transmitting region blocks is avoided, and in this manner, stability of light-transmitting display of the display panel is enhanced.

In an embodiment, at least one different type of light-transmitting regions exist among light-transmitting regions in different types of light-transmitting region blocks.

Referring to FIG. 21, in an embodiment, a display panel includes at least 2 types of different light-transmitting region blocks 10a and 10e. The display panel includes at least 8 types of different light-transmitting regions 11 which are a light-transmitting region A, a light-transmitting region B, a light-transmitting region C, a light-transmitting region D, a light-transmitting region E, a light-transmitting region F, a light-transmitting region G, and a light-transmitting region H, respectively. In an embodiment, the light-transmitting region block 10a includes 8 types of light-transmitting regions 11, and the light-transmitting region block 10e includes 6 types of light-transmitting regions 11. The 2 different light-transmitting region blocks 10a and 10e have different types of light-transmitting regions 11.

The display panel includes a plurality of light-transmitting region blocks of different types. A fixed grating will not be formed in the light-transmitting region block, diffraction of external light between adjacent light-transmitting region blocks is avoided, and in this manner, stability of light-transmitting display of the display panel is enhanced.

In an embodiment, the number of light-transmitting region blocks is X*Y, the X*Y light-transmitting region blocks are arranged in an array of X rows and Y columns, X is an integer greater than or equal to 2, and Y is an integer greater than or equal to 2; and Y light-transmitting region blocks located in the same row among the X rows includes at least two types of light-transmitting region blocks and the at least two types of light-transmitting region blocks are disposed adjacent to each other.

Referring to FIG. 23, a schematic diagram of another display panel according to an embodiment of the present disclosure is provided. As shown in FIG. 23, in an embodiment, a display panel includes at least 3 types of different light-transmitting region blocks 10a, 10e, and 10f. The display panel includes 8 types of different light-transmitting regions 11 which are a light-transmitting region A, a light-transmitting region B, a light-transmitting region C, a light-transmitting region D, a light-transmitting region E, a light-transmitting region F, a light-transmitting region G, and a light-transmitting region H, respectively. Arrangements of light-transmitting regions 11 in the different light-transmitting region blocks 10a, 10e and 10f are different.

In an embodiment, R=S=4. Light-transmitting region blocks in the first row in an array of light-transmitting region blocks are light-transmitting region blocks 10a, 10f, and 10e successively, and light-transmitting region blocks in the second row in the array of light-transmitting region blocks are light-transmitting region blocks 10f, 10e, and 10a successively. 3 light-transmitting region blocks located in the same row include at least two types of light-transmitting region blocks, and the at least two types of different light-transmitting region blocks are disposed adjacent to each other. In an embodiment, in the light-transmitting region block 10a, arrangement orders of light-transmitting regions 11 in four rows are ABCD, EFGH, FABC, and BCAF, respectively; in the light-transmitting region block 10e, arrangement orders of light-transmitting regions 11 in four rows are ABCD, BCDF, FABC, and CFAE, respectively; and in the light-transmitting region block 10f, arrangement orders of light-transmitting regions 11 in four rows are ABCD, BCHF, FABC, and CFAE, respectively.

With continued reference to FIG. 23, light-transmitting region blocks in the first column in the array of light-transmitting region blocks are light-transmitting region blocks 10a and 10f successively, light-transmitting region blocks in the second column in the array of light-transmitting region blocks are light-transmitting region blocks 10f and 10e successively, and light-transmitting region blocks in the third column in the array of light-transmitting region blocks are light-transmitting region blocks 10e and 10a successively. X light-transmitting region blocks located in the same column among the Y columns include at least two types of light-transmitting region blocks and the at least two types of different light-transmitting region blocks are disposed adjacent to each other.

In this embodiment, the display panel includes a plurality of light-transmitting region blocks of different types. Types of adjacent light-transmitting region blocks in the same row are different, or types of adjacent light-transmitting region blocks in the same column are different. Thus, a fixed grating will not be formed from the adjacent light-transmitting region blocks, diffraction of external light between the adjacent light-transmitting region blocks is avoided, and in this manner, stability of light-transmitting display of the display panel is enhanced.

In an embodiment, different types of light-transmitting region blocks among the Y light-transmitting region blocks located in the same row are arranged cyclically. In an embodiment, X light-transmitting region blocks located in the same column include at least two types of light-transmitting region blocks, the at least two types of light-transmitting region blocks are disposed adjacent to each other, and different types of light-transmitting region blocks among the X light-transmitting region blocks located in the same column are arranged cyclically.

Figures 24, 25:
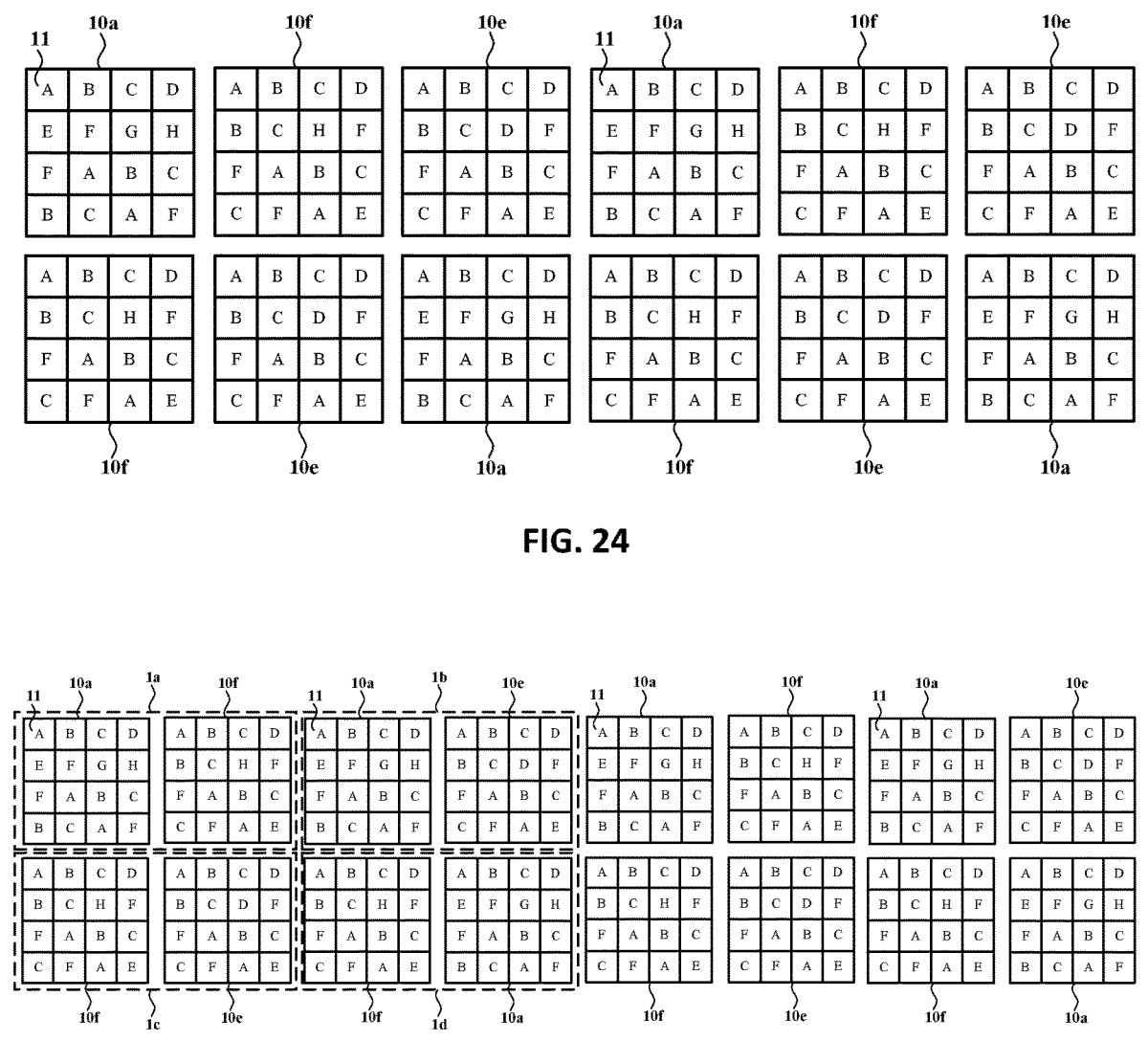

Referring to FIG. 24, a schematic diagram of another display panel according to an embodiment of the present disclosure is provided. As shown in FIG. 24, in an embodiment, a display panel includes at least 3 types of different light-transmitting region blocks 10a, 10e, and 10f. The display panel includes 8 types of different light-transmitting regions 11 which are a light-transmitting region A, a light-transmitting region B, a light-transmitting region C, a light-transmitting region D, a light-transmitting region E, a light-transmitting region F, a light-transmitting region G, and a light-transmitting region H, respectively. Arrangements of light-transmitting regions 11 in the different light-transmitting region blocks 10a, 10e and 10f are different. Different types of light-transmitting region blocks among the Y light-transmitting region blocks located in the same row are arranged cyclically.

In an embodiment, R=S=4. Light-transmitting region blocks in the first row in an array of light-transmitting region blocks include sequentially-arranged light-transmitting region blocks 10a, 10f, 10e, 10a, 10f, and 10e, it is apparent that the sequentially-arranged light-transmitting region blocks 10a, 10f, and 10e form one cycle, and Y light-transmitting region blocks in the first row may be arranged in the cycle of the sequentially-arranged light-transmitting region blocks 10a, 10f, and 10e. Light-transmitting region blocks in the second row in the array of light-transmitting region blocks include sequentially-arranged light-transmitting region blocks 10f, 10e, 10a, 10f, 10e, and 10a, it is apparent that the sequentially-arranged light-transmitting region blocks 10f, 10e, and 10a form one cycle, and Y light-transmitting region blocks in the second row may be arranged in the cycle of the sequentially-arranged light-transmitting region blocks 10f, 10e, and 10a.

Light-transmitting region blocks in the first column in the array of light-transmitting region blocks include sequentially-arranged light-transmitting region blocks 10a and 10f, the sequentially-arranged light-transmitting region blocks 10a and 10f may form one cycle, and X light-transmitting region blocks in the first column may be arranged in the cycle of the sequentially-arranged light-transmitting region blocks 10a and 10f. Light-transmitting region blocks in the second column in the array of light-transmitting region blocks include sequentially-arranged light-transmitting region blocks 10f and 10e, the sequentially-arranged light-transmitting region blocks 10f and 10e may form one cycle, and X light-transmitting region blocks in the second column may be arranged in the cycle of the sequentially-arranged light-transmitting region blocks 10f and 10e. Light-transmitting region blocks in the third column in the array of light-transmitting region blocks include sequentially-arranged light-transmitting region blocks 10e and 10a, the sequentially-arranged light-transmitting region blocks 10e and 10a may form one cycle, and X light-transmitting region blocks in the third column may be arranged in the cycle of the sequentially-arranged light-transmitting region blocks 10e and 10a.

Referring to FIG. 21, in an embodiment, a display panel includes merely 2 types of different light-transmitting region blocks 10a and 10e. The two types of different light-transmitting region blocks 10a and 10e in the display panel may be alternately arranged in a row direction and a column direction.

For light-transmitting region blocks in odd-numbered rows in an array of light-transmitting region blocks, an arrangement order of the light-transmitting region blocks may be 10a, 10e, 10a, 10e, 10a, 10e, . . . , sequentially-arranged light-transmitting region blocks 10a and 10e form one cycle, and Y light-transmitting region blocks in the odd-numbered rows may be arranged in the cycle of the sequentially-arranged light-transmitting region blocks 10a and 10e.

For light-transmitting region blocks in even-numbered rows in the array of light-transmitting region blocks, an arrangement order of the light-transmitting region blocks may be 10e, 10a, 10e, 10a, 10e, 10a, . . . , sequentially-arranged light-transmitting region blocks 10e and 10a form one cycle, and Y light-transmitting region blocks in the even-numbered rows may be arranged in the cycle of the sequentially-arranged light-transmitting region blocks 10e and 10a.

Correspondingly, for light-transmitting region blocks in odd-numbered columns in the array of light-transmitting region blocks, an arrangement order of the light-transmitting region blocks may be 10a, 10e, 10a, 10e, 10a, 10e, . . . , sequentially-arranged light-transmitting region blocks 10a and 10e form one cycle, and X light-transmitting region blocks in the odd-numbered columns may be arranged in the cycle of the sequentially-arranged light-transmitting region blocks 10a and 10e.

For light-transmitting region blocks in even-numbered columns in the array of light-transmitting region blocks, an arrangement order of the light-transmitting region blocks may be 10e, 10a, 10e, 10a, 10e, 10a, . . . , sequentially-arranged light-transmitting region blocks 10e and 10a form one cycle, and X light-transmitting region blocks in the even-numbered columns may be arranged in the cycle of the sequentially-arranged light-transmitting region blocks 10e and 10a.

In this embodiment, the display panel includes a plurality of light-transmitting region blocks of different types, and the different types of light-transmitting region blocks are arranged cyclically in the row direction or the column direction. Therefore, stability of light-transmitting display of the display panel is enhanced, and process and manufacture difficulty is reduced.

In an embodiment, the Y light-transmitting region blocks located in the same row includes at least two groups of light-transmitting region blocks and the at least two groups of light-transmitting region blocks are disposed adjacent to each other; and light-transmitting region blocks included by each of the at least two groups of light-transmitting region blocks are disposed adjacent to each other and types of the light-transmitting region blocks included by each of the at least two groups of light-transmitting region blocks are different.

Referring to FIG. 25, a schematic diagram of another display panel according to an embodiment of the present disclosure is provided. As shown in FIG. 25, in an embodiment, a display panel includes at least 3 types of different light-transmitting region blocks 10a, 10e, and 10f. The display panel includes 8 types of different light-transmitting regions 11 which are a light-transmitting region A, a light-transmitting region B, a light-transmitting region C, a light-transmitting region D, a light-transmitting region E, a light-transmitting region F, a light-transmitting region G, and a light-transmitting region H, respectively. Arrangements of light-transmitting regions 11 in the different light-transmitting region blocks 10a, 10e and 10f are different.

In an embodiment, an odd-numbered row in an array of light-transmitting region blocks shown in FIG. 25 is used as an example. Y light-transmitting region blocks in the odd-numbered row include two different groups 1a and 1b of light-transmitting region blocks, the groups 1a and 1b of light-transmitting region blocks are disposed adjacent to each other, and types of light-transmitting region blocks included in the groups 1a and 1b of light-transmitting region blocks are different. In an embodiment, the group 1a of light-transmitting region blocks includes 2 different light-transmitting region blocks 10a and 10f which are disposed adjacent to each other, the group 1b of light-transmitting region blocks includes 2 different light-transmitting region blocks 10a and 10e which are disposed adjacent to each other, and the light-transmitting region blocks 10f and 10e are different types of light-transmitting region blocks. In the odd-numbered row, the groups 1a and 1b of light-transmitting region blocks are alternately arranged. Thus, groups 1a of light-transmitting region blocks are arranged cyclically in a row direction of an array, and groups 1b of light-transmitting region blocks are arranged cyclically in the row direction of the array.

In an even-numbered row in the array of light-transmitting region blocks shown in FIG. 25, Y light-transmitting region blocks include two different groups 1c and 1d of light-transmitting region blocks, the groups 1c and 1d of light-transmitting region blocks are disposed adjacent to each other, and types of light-transmitting region blocks included in the groups 1c and 1d of light-transmitting region blocks are different. In an embodiment, the group 1c of light-transmitting region blocks includes 2 different light-transmitting region blocks 10f and 10e which are disposed adjacent to each other, the group 1d of light-transmitting region blocks includes 2 different light-transmitting region blocks 10f and 10a which are disposed adjacent to each other, and the light-transmitting region blocks 10f and 10e are different types of light-transmitting region blocks. In the even-numbered row, the groups 1c and 1d of light-transmitting region blocks are alternately arranged. Thus, groups 1c of light-transmitting region blocks are arranged cyclically in the row direction of the array, and groups 1d of light-transmitting region blocks are arranged cyclically in the row direction of the array.

It is to be understood that in a column direction of the array, the X light-transmitting region blocks located in the same column includes at least two groups of light-transmitting region blocks and the at least two groups of light-transmitting region blocks are disposed adjacent to each other; and light-transmitting region blocks included by each of the at least two groups of light-transmitting region blocks are disposed adjacent to each other and types of the light-transmitting region blocks included by each of the at least two groups of light-transmitting region blocks are different, which will not be illustrated by a figure here.

It is to be noted that, in the array of light-transmitting region blocks in the display panel, as shown in FIG. 25, in an embodiment, arrangement manners of light-transmitting region blocks in adjacent rows may be different, and arrangement manners of light-transmitting region blocks in adjacent columns may be different. However, in other embodiments, in an embodiment, arrangement manners of light-transmitting region blocks in adjacent rows are exactly the same.

As described above, the light-transmitting region block 10a in FIG. 25 is used as an example, the light-transmitting region block 10f or the light-transmitting region block 10e is disposed between 2 adjacent light-transmitting region blocks 10a in the odd-numbered row. Types of the light-transmitting region block 10f and the light-transmitting region block 10e are different so that the same type of light-transmitting region blocks are not arranged cyclically in the row direction of the array and diffraction of external light can be further reduced. It is to be understood that the number of light-transmitting region blocks disposed between the same light-transmitting region blocks in each row may be one or more, which is not specifically limited in the embodiment of the present disclosure.

Similarly, the same type of light-transmitting region blocks may not be arranged cyclically in the column direction of the array and the diffraction of external light can be further reduced. The number of light-transmitting region blocks disposed between the same light-transmitting region blocks in each column may be one or more, which is not specifically limited in the embodiment of the present disclosure.

A plurality of light-transmitting region blocks disposed between two adjacent same light-transmitting region blocks in the same row or the same column are not of duplicate types. Referring to FIG. 25, the light-transmitting region blocks disposed between the two adjacent light-transmitting region blocks 10a in the odd-numbered row are 10f or 10e. In an embodiment, a part of a plurality of light-transmitting region blocks disposed between two adjacent same light-transmitting region blocks in the same row or the same column are of duplicate types. Referring to FIG. 25, the plurality of light-transmitting region blocks disposed between the two adjacent light-transmitting region blocks 10e in the even-numbered row are 10f, 10a, and 10f successively among which the same light-transmitting region block 10f exists.

In an embodiment, types of light-transmitting region blocks in at least two groups of light-transmitting region blocks are the same, and arrangement rules of the light-transmitting region blocks in the at least two groups of light-transmitting region blocks are different. In an embodiment, the numbers of light-transmitting region blocks in at least two groups of light-transmitting region blocks are different. In an embodiment, the numbers of light-transmitting region blocks in at least two groups of light-transmitting region blocks are the same and the at least two groups of light-transmitting region blocks differ from each other in at least one type of light-transmitting region block.

Figure 26:
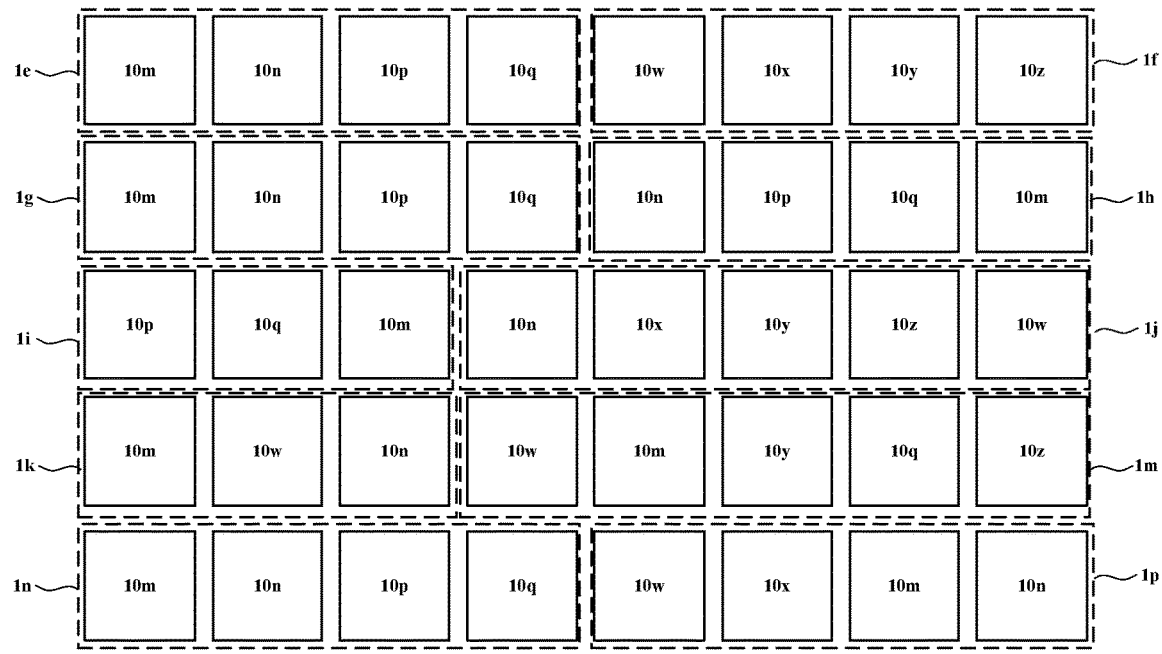
FIG. 26 is a schematic diagram of another display panel according to an embodiment of the present disclosure.

Referring to FIG. 26, a schematic diagram of another display panel according to an embodiment of the present disclosure is provided. As shown in FIG. 26, the Y light-transmitting region blocks located in the same row include at least two groups of light-transmitting region blocks and the at least two groups of light-transmitting region blocks are disposed adjacent to each other; and light-transmitting region blocks included by each of the at least two groups of light-transmitting region blocks are disposed adjacent to each other and types of the light-transmitting region blocks included by each of the at least two groups of light-transmitting region blocks are different.

As shown in FIG. 26, in an embodiment, a display panel includes a group 1e of light-transmitting region blocks and a group 1f of light-transmitting region blocks disposed adjacent to each other in the same row, and types of light-transmitting region blocks included by the group 1e of light-transmitting region blocks may be different from types of light-transmitting region blocks included by the group 1f of light-transmitting region blocks. For example, each group includes 4 light-transmitting region blocks, where the group 1e of light-transmitting region blocks includes light-transmitting region blocks 10m, 10n, 10p, and 10q which are disposed adjacent to each other, the group 1f of light-transmitting region blocks includes light-transmitting region blocks 10w, 10x, 10y, and 10z which are disposed adjacent to each other, and the light-transmitting region blocks 10m, 10n, 10p, 10q, 10w, 10x, 10y, and 10z are eight types of different light-transmitting region blocks.

As shown in FIG. 26, in an embodiment, a display panel includes a group 1g of light-transmitting region blocks and a group 1h of light-transmitting region blocks disposed adjacent to each other in the same row, and types of light-transmitting region blocks included by the group 1g of light-transmitting region blocks may exactly the same as types of light-transmitting region blocks included by the group 1h of light-transmitting region blocks. For example, each group includes 4 light-transmitting region blocks, where the group 1g of light-transmitting region blocks includes sequentially-arranged light-transmitting region blocks 10m, 10n, 10p, and 10q, the group 1h of light-transmitting region blocks includes sequentially-arranged light-transmitting region blocks 10n, 10p, 10q, and 10m, and the light-transmitting region blocks 10m, 10n, 10p and 10q are four types of different light-transmitting region blocks. An arrangement rule of the light-transmitting region blocks included by the group 1g of light-transmitting region blocks is different from an arrangement rule of the light-transmitting region blocks included by the group 1h of light-transmitting region blocks.

As shown in FIG. 26, in an embodiment, a display panel includes a group 1i of light-transmitting region blocks and a group 1j of light-transmitting region blocks disposed adjacent to each other in the same row, and the number of light-transmitting region blocks included by the group 1i of light-transmitting region blocks may be different from the number of light-transmitting region blocks included by the group 1j of light-transmitting region blocks. For example, the group 1i of light-transmitting region blocks includes 3 light-transmitting region blocks 10p, 10q, and 10m, and the group 1j of light-transmitting region blocks includes 5 light-transmitting region blocks 10n, 10x, 10y, 10z, and 10w. Types of light-transmitting region blocks included by the group 1i of light-transmitting region blocks may be completely different from types of light-transmitting region blocks included by the group 1j of light-transmitting region blocks.

As shown in FIG. 26, in an embodiment, a display panel includes a group 1n of light-transmitting region blocks and a group 1p of light-transmitting region blocks disposed adjacent to each other in the same row, and the number of light-transmitting region blocks included by the group 1n of light-transmitting region blocks may be the same as the number of light-transmitting region blocks included by the group 1p of light-transmitting region blocks, for example, each group includes 4 light-transmitting region blocks. The group 1n of light-transmitting region blocks includes light-transmitting region blocks 10m, 10n, 10p, and 10q, the group 1p of light-transmitting region blocks includes light-transmitting region blocks 10w, 10x, 10m, and 10n, and the group 1n of light-transmitting region blocks and the group 1p of light-transmitting region blocks differ from each other in at least one type of light-transmitting region blocks.

Figure 27:
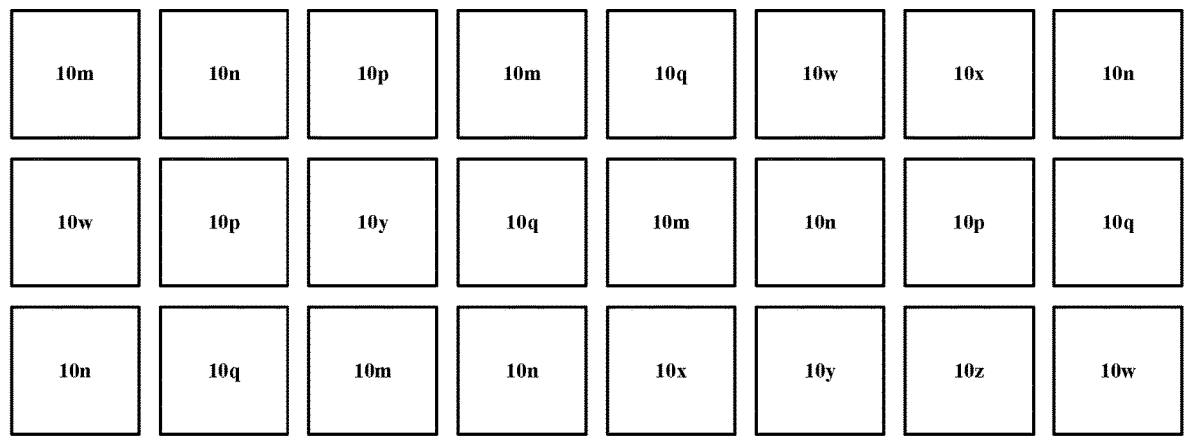
FIG. 27 is a schematic diagram of another display panel according to an embodiment of the present disclosure.

In an embodiment, the Y light-transmitting region blocks located in the same row include M types of light-transmitting region blocks and M<Y. Referring to FIG. 27, a schematic diagram of another display panel according to an embodiment of the present disclosure is provided.

As shown in FIG. 27, in an embodiment, a display panel includes M types of light-transmitting region blocks. The display panel further includes an array of light-transmitting region blocks in X rows and Y columns. M<Y. In an embodiment, M=6, Y=8, and the display panel includes 6 different types of light-transmitting region blocks which are 10m, 10n, 10p, 10q, 10w, and 10x, respectively. In an embodiment, 8 light-transmitting region blocks in the same row in the display panel include 6 different types of light-transmitting region blocks. An arrangement order of the 8 light-transmitting region blocks may be 10m, 10n, 10p, 10m, 10q, 10w, 10x, and 10n, and the number of at least one type of light-transmitting region blocks among the Y light-transmitting region blocks in the same row is plural.

In an embodiment, the number of types of light-transmitting region blocks of the display panel is greater than M. For example, the display panel includes 8 different types of light-transmitting region blocks which are 10m, 10n, 10p, 10q, 10w, 10x, 10y, and 10z, respectively. The display panel further includes the array of light-transmitting region blocks in X rows and Y columns, M<Y, and Y light-transmitting region blocks located in the same row are M types of light-transmitting region blocks among the types of light-transmitting region blocks of the display panel. Types of light-transmitting region blocks in at least two adjacent rows in the display panel are different.

As shown in FIG. 27, in an embodiment, M=6, Y=8, 8 light-transmitting region blocks in the first row in the display panel include 6 different types of light-transmitting region blocks, and an arrangement order of the 8 light-transmitting region blocks may be 10m, 10n, 10p, 10m, 10q, 10w, 10x, and 10n. In an embodiment, M=6, Y=8, 8 light-transmitting region blocks in the second row in the display panel include 6 different types of light-transmitting region blocks, and an arrangement order of the 8 light-transmitting region blocks may be 10w, 10p, 10y, 10q, 10m, 10n, 10p, and 10q. In an embodiment, M=7, Y=8, 8 light-transmitting region blocks in the third row in the display panel include 7 different types of light-transmitting region blocks, and an arrangement order of the 8 light-transmitting region blocks may be 10n, 10q, 10m, 10n, 10x, 10y, 10z, and 10w.

In an embodiment, in one light-transmitting region block, light-transmitting regions in two adjacent rows are in a staggered arrangement. In this embodiment, a light-transmitting region block includes R*S light-transmitting regions, a display panel includes N types of different light-transmitting regions, and N is an integer greater than or equal to 2.

Figure 28:
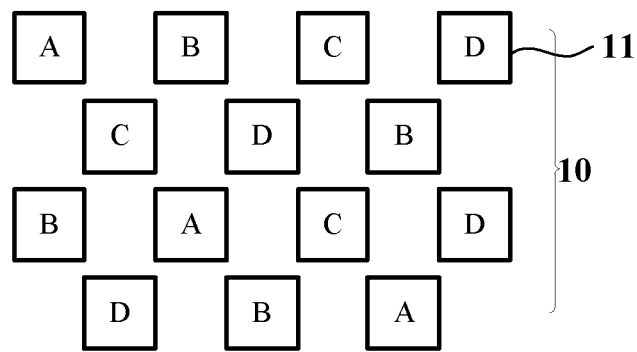
FIG. 28 is a schematic diagram of another light-transmitting region block according to an embodiment of the present disclosure.

Referring to FIG. 28, a schematic diagram of another light-transmitting region block according to an embodiment of the present disclosure is provided. In an embodiment, R=4, S is less than or equal to 4, N=4, and four types of light-transmitting regions A, B, C, and D are included in a light-transmitting region block 10. The four types of different light-transmitting regions 11 are in a staggered arrangement in two adjacent rows and two adjacent columns. Adjacent light-transmitting regions 11 are different light-transmitting regions 11.

In an embodiment, an absolute value of a difference between transmittances of different light-transmitting regions is less than 10%. In this embodiment, a light-transmitting region block includes a plurality of different light-transmitting regions. Adjacent light-transmitting regions in the light-transmitting region block are different types of light-transmitting regions, and the absolute value of the difference between transmittances of the different types of light-transmitting regions is designed to be less than 10% so that display uniformity of the light-transmitting region block can be improved.

In an embodiment, the display panel further includes a display region, the display region includes a first display region, the first display region is an optical device reservation region, and the light-transmitting region block is located in the first display region; or the display region is divided into a plurality of light-transmitting region blocks.

Based on the same inventive concept, the embodiments of the present disclosure further provide a display device which includes the display panel described in any one of the above embodiments. The display device provided by this embodiment may be a transparent display device.

In this embodiment, the display device includes the display panel described in the above embodiments. The display panel includes the light-transmitting region block. The S light-transmitting regions located in the same row in the light-transmitting region block are the S types of different light-transmitting regions, and the R light-transmitting regions located in the same column are the R types of different light-transmitting regions. The adjacent light-transmitting regions in the light-transmitting region block are the different types of light-transmitting regions so that the same light-transmitting regions will not gather, the overall light passing effect can be improved, and the diffraction effect is reduced when an observed object is displayed through the transparent display panel. Thus, interference fringes in a light-emitting region are reduced, and the display effect is improved.

It is to be noted that the above are merely preferred embodiments of the present disclosure and the principles used therein. It is to be understood by those skilled in the art that the present disclosure is not limited to the embodiments described herein. Those skilled in the art can make various apparent changes, adaptations, combinations, and substitutions without departing from the scope of the present disclosure. Therefore, although the present disclosure has been described in detail through the above embodiments, the present disclosure is not limited to the above embodiments and may include more other equivalent embodiments without departing from the concept of the present disclosure. The scope of the present disclosure is determined by the scope of the appended claims.

What is claimed is:

1. A display panel, comprising:
   a light-transmitting region block, wherein the light-transmitting region block comprises R*S light-transmitting regions arranged in R rows and S columns, R is an integer greater than or equal to 2, and S is an integer greater than or equal to 2;
   in the light-transmitting region block, S light-transmitting regions located in a same row are S types of different light-transmitting regions, and R light-transmitting regions located in a same column are R types of different light-transmitting regions; and
   a plurality of light-transmitting region blocks, and at least two light-transmitting regions blocks among the plurality of light-transmitting region blocks are different types of light-transmitting region blocks.

2. The display panel according to claim 1, wherein in the light-transmitting region block, for light-transmitting regions located in two adjacent rows, types of light-transmitting regions located in one row of the two adjacent rows are the same as types of light-transmitting regions located in another row of the two adjacent rows.

3. The display panel according to claim 1, wherein in the light-transmitting region block, for light-transmitting regions located in two adjacent rows, types of light-transmitting regions located in one row of the two adjacent rows comprise at least one type different from types of light-transmitting regions located in another row of the two adjacent rows.

4. The display panel according to claim 1, comprising a plurality of light-transmitting region blocks; wherein types of adjacent light-transmitting regions respectively located in two adjacent light-transmitting region blocks among the plurality of light-transmitting region blocks are different.

5. The display panel according to claim 1, comprising X*Y light-transmitting region blocks, wherein the X*Y light-transmitting region blocks are arranged in an array of X rows and Y columns, X is an integer greater than or equal to 2, and Y is an integer greater than or equal to 2; and
   the X*Y light-transmitting region blocks are of a same type.

6. The display panel according to claim 1, wherein different types of light-transmitting region blocks have same types of light-transmitting regions and have different arrangement rules.

7. The display panel according to claim 1, wherein different types of light-transmitting region blocks have at least one different type of light-transmitting region.

8. The display panel according to claim 1, comprising X*Y light-transmitting region blocks, wherein the X*Y light-transmitting region blocks are arranged in an array of X rows and Y columns, X is an integer greater than or equal to 2, and Y is an integer greater than or equal to 2; and
Y light-transmitting region blocks located in a same row among the X rows comprise at least two types of light-transmitting region blocks and the at least two types of light-transmitting region blocks are disposed adjacent to each other.

9. The display panel according to claim 8, wherein different types of light-transmitting region blocks among the Y light-transmitting region blocks located in a same row are arranged cyclically.

10. The display panel according to claim 8, wherein X light-transmitting region blocks located in a same column among the Y columns comprise at least two types of light-transmitting region blocks and the at least two types of light-transmitting region blocks are disposed adjacent to each other; and different types of light-transmitting region blocks among the X light-transmitting region blocks located in a same column are arranged cyclically.

11. The display panel according to claim 8, wherein
the Y light-transmitting region blocks located in the same row comprises at least two groups of light-transmitting region blocks and the at least two groups of light-transmitting region blocks are disposed adjacent to each other; and
light-transmitting region blocks comprised by each of the at least two groups of light-transmitting region blocks are disposed adjacent to each other and are of different types;
wherein the at least two groups of light-transmitting region blocks comprise at least one of:
the at least two groups of light-transmitting region blocks have same types of light-transmitting region blocks and have different arrangement rules;
the at least two groups of light-transmitting region blocks have different numbers of light-transmitting region blocks; or
the at least two groups of light-transmitting region blocks have a same number of light-transmitting region blocks and have at least one different type of light-transmitting region block.

12. The display panel according to claim 1, wherein in the light-transmitting region block, light-transmitting regions in two adjacent rows are arranged in a staggered manner.

13. The display panel according to claim 1, further comprising:
a substrate; and
a first film located on the substrate;
wherein in different light-transmitting regions, at least one of the following cases exists:
case 1), first films in the different light-transmitting regions have different thicknesses;
case 2), the first films in the different light-transmitting regions are made of different materials; or
case 3), the first film comprises at least two sub-films stacked, and thickness ratios of the at least two sub-films of first films in the different light-transmitting regions are different.

14. The display panel according to claim 1, wherein
each light-transmitting region among the R*S light-transmitting regions comprises at least two sub-regions and structures of the at least two sub-regions are different; and
in different light-transmitting regions among the R*S light-transmitting regions, arrangement manners of the at least two sub-regions are different.

15. The display panel according to claim 1, wherein shapes of different light-transmitting regions are different.

16. The display panel according to claim 1, wherein an absolute value of a difference between transmittances of different light-transmitting regions is less than 10%.

17. The display panel according to claim 1, further comprising a light-emitting element, wherein the light-emitting element is located between two adjacent light-transmitting regions.

18. The display panel according to claim 1, further comprising a display region, wherein
the display region comprises a first display region, the first display region is an optical device reservation region, and the light-transmitting region block is located in the first display region; or
the display region is divided into a plurality of light-transmitting region blocks.

19. A display device, comprising a display panel, wherein the display panel comprises:
a light-transmitting region block, wherein the light-transmitting region block comprises R*S light-transmitting regions arranged in R rows and S columns, R is an integer greater than or equal to 2, and S is an integer greater than or equal to 2;
in the light-transmitting region block, S light-transmitting regions located in a same row are S types of different light-transmitting regions, and R light-transmitting regions located in a same column are R types of different light-transmitting regions; and
a plurality of light-transmitting region blocks, and at least two light-transmitting region blocks among the plurality of light-transmitting region blocks are different types of light-transmitting region blocks.

* * * * *